United States Patent
Konagai et al.

(10) Patent No.: US 9,935,121 B2
(45) Date of Patent: Apr. 3, 2018

(54) THREE DIMENSIONAL VERTICAL CHANNEL SEMICONDUCTOR MEMORY DEVICE

(71) Applicant: Toshiba Memory Corporation, Minato-ku (JP)

(72) Inventors: Satoshi Konagai, Kasugai (JP); Yoshihiro Akutsu, Yokkaichi (JP); Masaru Kito, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/063,887

(22) Filed: Mar. 8, 2016

(65) Prior Publication Data

US 2017/0077131 A1 Mar. 16, 2017

Related U.S. Application Data

(60) Provisional application No. 62/216,793, filed on Sep. 10, 2015.

(51) Int. Cl.
| | |
|---|---|
| *H01L 29/792* | (2006.01) |
| *H01L 27/11582* | (2017.01) |
| *H01L 21/768* | (2006.01) |
| *H01L 27/11565* | (2017.01) |

(52) U.S. Cl.
CPC .. *H01L 27/11582* (2013.01); *H01L 21/76879* (2013.01); *H01L 27/11565* (2013.01)

(58) Field of Classification Search
CPC ................. H01L 27/00; H01L 29/00
See application file for complete search history.

(56) References Cited

U.S. PATENT DOCUMENTS

| | | | |
|---|---|---|---|
| 8,039,886 B2 | 10/2011 | Mizukami et al. | |
| 8,502,321 B2 | 8/2013 | Izumi et al. | |
| 8,582,341 B2 | 11/2013 | Fukuzumi et al. | |
| 8,779,499 B2 | 7/2014 | Kiyotoshi | |
| 9,356,043 B1* | 5/2016 | Sakakibara | ....... H01L 27/11582 |
| 2009/0267128 A1 | 10/2009 | Maejima | |
| 2012/0273865 A1 | 11/2012 | Lee et al. | |
| 2014/0054670 A1* | 2/2014 | Lee | ........ H01L 21/764 |
| | | | 257/319 |
| 2015/0380418 A1* | 12/2015 | Zhang | ....... H01L 27/11529 |
| | | | 257/326 |
| 2015/0380428 A1 | 12/2015 | Matsuda | |
| 2016/0079267 A1 | 3/2016 | Fukuzumi et al. | |
| 2016/0093634 A1* | 3/2016 | Jang | ....... H01L 29/495 |
| | | | 257/324 |

(Continued)

*Primary Examiner* — Ismail Muse
(74) *Attorney, Agent, or Firm* — Oblon, McClelland, Maier & Neustadt, L.L.P.

(57) ABSTRACT

According to one embodiment, a semiconductor memory device includes a stacked body, a semiconductor pillar, a memory film and a conductive member. The stacked body includes a plurality of electrode layers arranged in a first direction. The semiconductor pillar extends in the stacked body in the first direction. The memory film provides between the stacked body and the semiconductor pillar. The conductive member includes a contact and an interconnect. The contact includes metal, the contact extending in the stacked body in the first direction. The interconnect extends in a second direction crossing the first direction, and the interconnect including metal.

10 Claims, 22 Drawing Sheets

(56) References Cited

U.S. PATENT DOCUMENTS

2016/0163389 A1* 6/2016 Zhang ................ G11C 16/0483
  365/185.17
2016/0365352 A1* 12/2016 Nishikawa ........ H01L 27/11582

* cited by examiner

THREE DIMENSIONAL VERTICAL CHANNEL SEMICONDUCTOR MEMORY DEVICE

CROSS-REFERENCE TO RELATED APPLICATIONS

This application is based upon and claims the benefit of priority from U.S. Provisional Patent Application 62/216,793, filed on Sep. 10, 2015; the entire contents of which are incorporated herein by reference.

FIELD

Embodiments described herein relate generally to a memory device and a method for manufacturing the same.

BACKGROUND

In recent years, a semiconductor memory device has been proposed in which memory cells are integrated three-dimensionally. Higher density is desired for the memory cells in such a three-dimensionally stacked semiconductor memory device.

DETAILED DESCRIPTION

Figure 1:
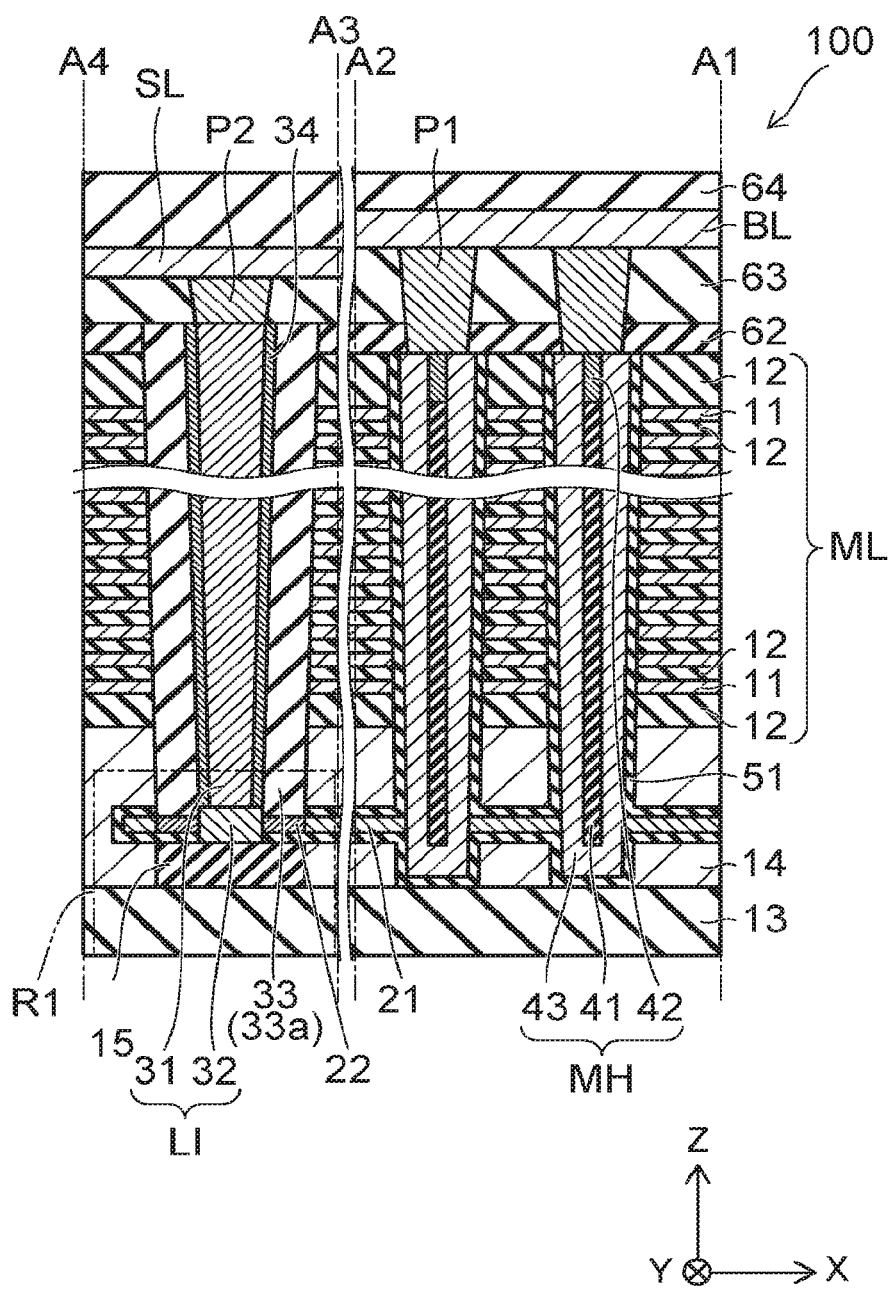
FIG. 1 is a cross-sectional view illustrating an example of a semiconductor memory device according to a first embodiment.

According to one embodiment, a semiconductor memory device includes a stacked body, a semiconductor pillar, a memory film and a conductive member. The stacked body includes a plurality of electrode layers arranged in a first direction. The semiconductor pillar extends in the stacked body in the first direction. The memory film provides between the stacked body and the semiconductor pillar. The conductive member includes a contact and an interconnect. The contact portion includes metal, the contact portion extending in the stacked body in the first direction. The interconnect extends in a second direction crossing the first direction, and the interconnect portion including metal.

Embodiment of the invention will be described hereinafter with reference to the accompanying drawings.

Note that, the drawings are schematic or conceptual. Relations between thicknesses and widths of portions, ratios of sizes among the portions, and the like are not always the same as real ones. Even when the same portions are shown, the portions are sometimes shown in different dimensions and ratios depending on the drawings. Note that in the specification and the drawings, components described with reference to the drawings already referred to are denoted by the same reference numerals and signs. Detailed description of the components is omitted as appropriate.

First Embodiment

FIG. 1 is a cross-sectional view illustrating an example of a semiconductor memory device according to the first embodiment.

Figure 2A:
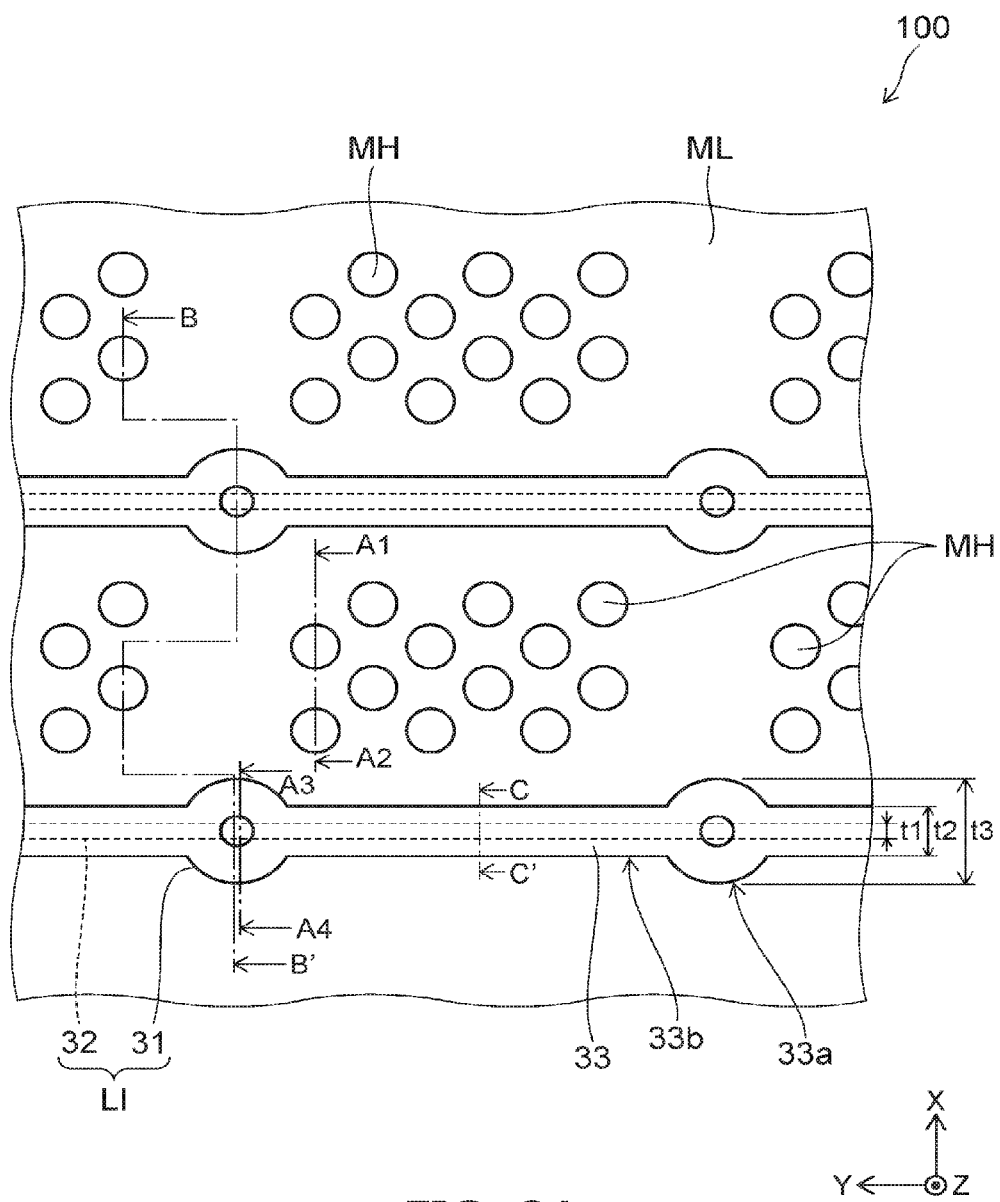
FIG. 2A is a plan view illustrating the example of the semiconductor memory device according to the first embodiment.

FIG. 2A is a plan view illustrating the example of the semiconductor memory device according to the first embodiment.

Figure 2B:
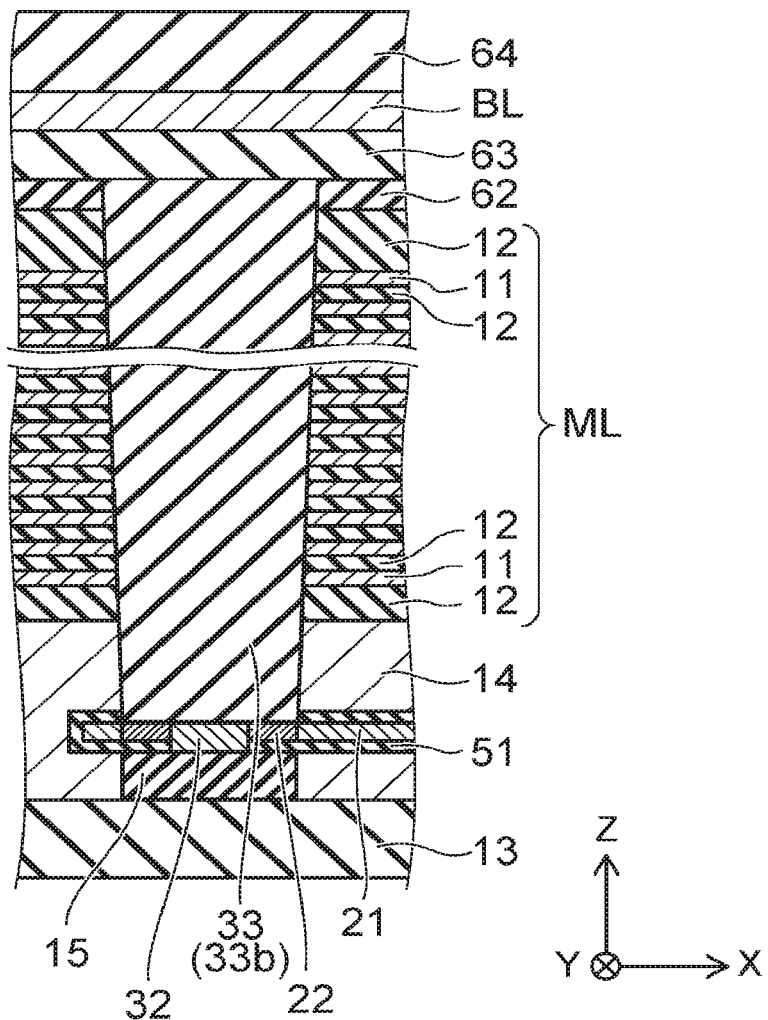
FIG. 2B is a cross-sectional view illustrating the example of the semiconductor memory device according to the first embodiment.

FIG. 2B is a cross-sectional view illustrating the example of the semiconductor memory device according to the first embodiment.

FIG. 1 is a schematic cross-sectional view illustrating a cross-section along line A1-A2 and A3-A4 in FIG. 2A of the semiconductor device according to the first embodiment. FIG. 2B is a cross-sectional view along line C-C' in FIG. 2A illustrating the semiconductor device according to the first embodiment.

As illustrated in FIG. 1, a semiconductor memory device 100 according to the embodiment is provided with a stacked body ML including a plurality of electrode layers 11, an insulating layer 13 (a first insulating layer), a semiconductor pillar MH, and a first insulating film 33. A back gate electrode film 14 (an electrode film) is provided between the stacked body ML and the insulating layer 13. A direction of extension of the semiconductor pillar MH is termed a Z direction (a first direction). A direction orthogonal to the Z direction is termed a Y direction (a second direction). A direction orthogonal to the Z direction and the Y direction is termed an X direction (a third direction).

A connecting member 21 is provided within the back gate electrode film 14. The connecting member 21 is a plate extending along the X-Y plane, for example.

The semiconductor pillar MH extends along the Z direction within the stacked body ML, the back gate electrode film 14, and the connecting member 21. The semiconductor pillar MH includes, for example, a core insulating member 41, a dispersion layer 42, and a semiconductor film 43. The core insulating member 41 extends along the Z direction within the stacked body ML, the connecting member 21, and the back gate electrode film 14. The dispersion layer 42 is provided on the core insulating member 41. The semiconductor film 43 is provided between the dispersion layer 42 and the stacked body ML, between the core insulating member 41 and the stacked body ML, between the core insulating member 41 and the connecting member 21, between the core insulating member 41 and the back gate electrode film 14, and between the core insulating member 41 and the insulating layer 13. The semiconductor pillar MH is electrically connected to the connecting member 21.

A memory film 51 is provided between the semiconductor pillar MH and the stacked body ML, between the semiconductor pillar MH and the back gate electrode film 14, between the semiconductor pillar MH and the insulating layer 13, and between the connecting member 21 and the back gate electrode film 14. The memory film includes, for example, a block insulating film, a charge storage film, and a tunnel insulating film. The block insulating film is provided between the stacked body ML and the semiconductor pillar MH, between the back gate electrode film 14 and the semiconductor pillar MH, between the insulating layer 13 and the semiconductor pillar MH, and between the back gate electrode film 14 and the connecting member 21. The tunnel insulating film is provided between the block insulating film and the semiconductor pillar MH, and between the block insulating film and the connecting member 21. The charge storage film is provided between the tunnel insulating film and the block insulating film.

The block insulating film is a film through which electric current does not flow substantially despite application of voltage within a range of driving voltage of the semiconductor memory device 100. The charge storage film has a capability to store an electric charge. The tunnel insulating film is typically insulating, but also allows tunnel current to flow upon application of a predetermined voltage within the range of drive current of the semiconductor memory device 100.

The tunnel insulating film and the block insulating film include silicon oxide, for example. The tunnel insulating film and the block insulating film may include, for example, any of $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, and AlSiO. The charge storage film includes silicon nitride, for example.

The charge storage film may also be a film including an insulating material. The charge storage film may be a film including a conducting material. The charge storage film may be separated among upper and lower memory cells. The memory film MF may include a floating gate.

The electrode layers 11 are arranged in the Z direction, in the stacked body ML. Insulating bodies are provided between each pair of the electrode layers, in the stacked body ML. The insulating bodies are, for example, inter-electrode insulating layers 12 including silicon oxide. The insulating bodies may also be air gaps. The back gate electrode film 14 includes polysilicon, for example, which in turn includes impurities such as boron.

An insulating layer 62 is provided on the stacked body ML.

A first insulating film 33, described in detail later, extends along the Z direction and the Y direction within the insulating layer 62, the stacked body ML, and the back gate electrode film 14. A conductive member LI is provided within the back gate electrode film 14 and the first insulating film 33. The conductive member LI is electrically connected to the connecting member 21.

The conductive member LI includes a contact portion 31 (a first portion) and an interconnect portion 32 (a second portion). The contact portion 31 extends along the Z direction within the first insulating film 33, the stacked body ML, and the back gate electrode film 14. The interconnect portion 32 extends along the Y direction within the back gate electrode film 14. With respect to a direction intersecting the X direction (for example, the X direction and the Y direction), at least a portion of the interconnect portion 32 overlaps at least a portion of the connecting member 21. The contact portion 31 includes a metal, such as tungsten. The interconnect portion 32 also includes a metal, such as tungsten. A dispersion layer 22 is provided between the interconnect portion 32 and the connecting member 21.

A second insulating film 15 is provided between the insulating layer 13 and the interconnect portion 32. The second insulating film 15 extends along the Y direction.

A barrier metal film 34 is provided between the first insulating film 33 and the contact portion 31.

An insulating layer 63 is provided on the insulating layer 62 and the insulating pillar HR. A plug P1 is provided on the semiconductor pillar MH. The plug P1 extends along the Z direction within the insulating layers 63 and 62. A plug P2 is provided on the contact portion 31. The plug P2 is provided within the insulating layer 63. A source line SL is provided on the plug P2. The source line SL extends in the X direction, for example, within the insulating layer 63. The source line SL also extends in the X direction, for example, within the stacked body ML. The source line SL and the contact portion 31 are electrically connected through the plug P2.

An insulating layer 64 is provided over the insulating layer 63. A bit line BL is provided on the plug P1. The bit line BL extends in the X direction, for example, within the insulating layer 64. The bit line BL and the semiconductor pillar MH are electrically connected through the plug P1.

As illustrated in FIG. 2A, a plurality of the semiconductor pillars MH is arranged, for example, in a matrix shape, between neighboring pairs of the first insulating film 33 with respect to the Y direction. In FIG. 2A, components other than the stacked body ML, the semiconductor pillars MH, the first insulating film 33, and the conductive members LI are omitted from illustration.

The first insulating film 33 includes a first insulating portion 33a and a second insulating portion 33b. The first insulating portion 33a has a substantially cylindrical shape extending in the Z direction. The contact portion 31 of the conductive member LI extending in the Z direction is disposed within the first insulating portion 33a. The second insulating portion 33b has a plate shape extending in the Y direction and the Z direction. In the first insulating film 33, the first insulating portion 33a and the second insulating portion 33b are arranged in the Y direction. For example, each of the second insulating portions 33b is provided between each pair of the first insulating portions 33a arranged with spacing in the Y direction.

With respect to the Z direction, at least a portion of the interconnect portion 32 of the conductive member LI overlaps at least a portion of the second insulating portion 33b of the first insulating film 33. A first length t1 of the interconnect portion 32 with respect to the X direction is shorter than a second length t2 of the second insulating portion 33b with respect to the X direction. A third length t3 of the first insulating portion 33a with respect to the X direction is longer than the second length of the second insulating portion 33b with respect to the X direction. The third length t3 is, for example, the length of a longest portion of the first insulating portion 33a with respect to the X direction.

As illustrated in FIG. 2B, a portion of the interconnect portion 32 extends in the Y direction between the first insulating portion 32 and the second insulating film 15.

A first example of a manufacturing method of the semiconductor memory device 100 according to the embodiment is described.

FIGS. 3 to 6 are process cross-sectional views each illustrating the example of the manufacturing method for the semiconductor memory device according to the embodiment.

Figure 7:
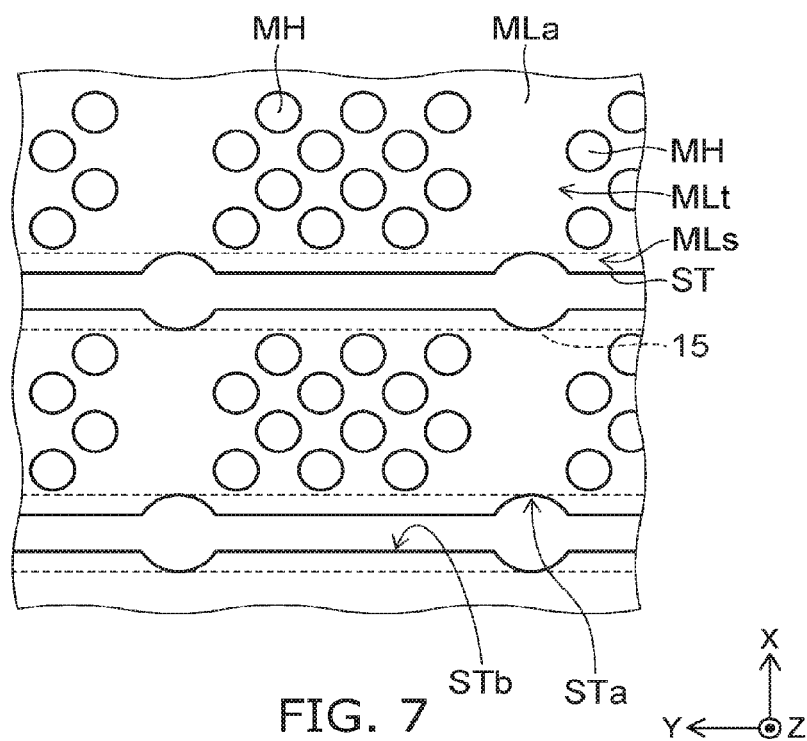
FIG. 7 is a plan view illustrating the example of the manufacturing method for the semiconductor memory device according to the first embodiment.

FIG. 7 is a plan view illustrating the example of the manufacturing method for the semiconductor memory device according to the embodiment.

FIGS. 8 to 13 are process cross-sectional views each illustrating the example of the manufacturing method for the semiconductor memory device according to the embodiment.

Figure 3:
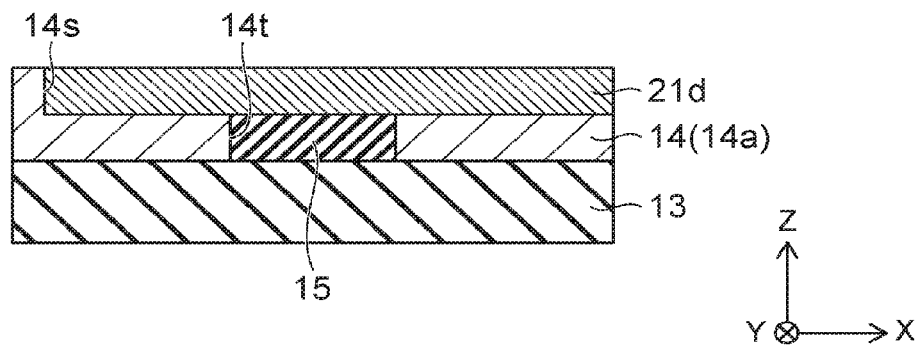
FIGS. 3 to 6 are process cross-sectional views each illustrating the example of the manufacturing method for the semiconductor memory device according to the first embodiment.
Figure 4:
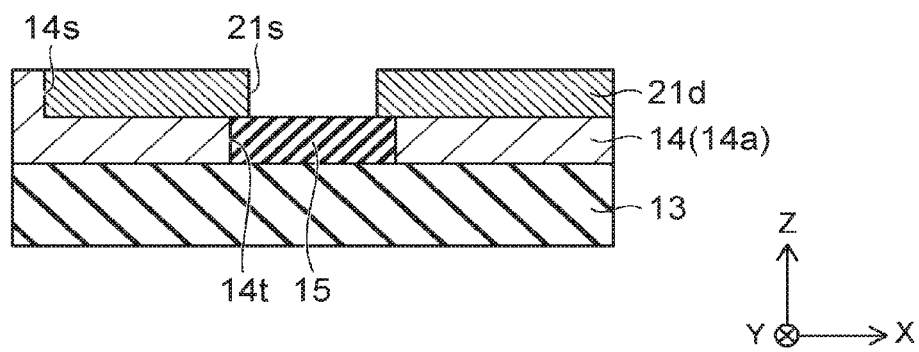
Figure 5:
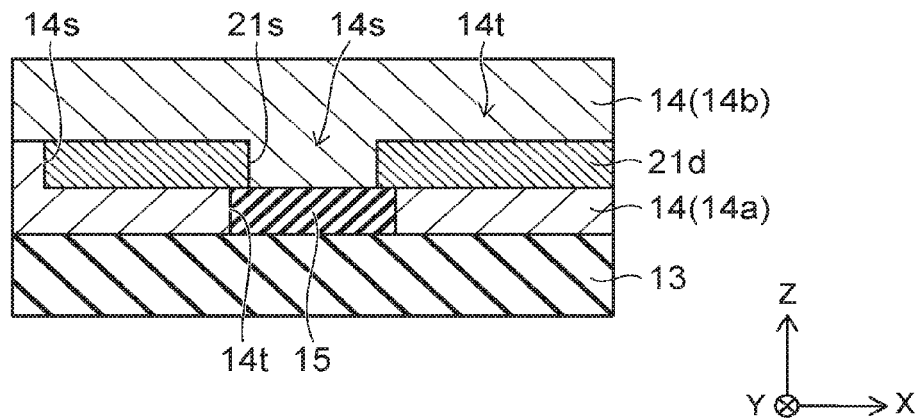

FIGS. 3 to 5 are cross-sectional views each illustrating regions corresponding to region R1 illustrated in FIG. 1. FIGS. 6 and 8 to 12 are cross-sectional diagrams each illustrating examples of cross-sections corresponding to the cross-section along line B-B' in FIG. 2A. FIG. 13 is a cross-sectional diagram illustrating an example of a cross-section corresponding to the cross-section along line C-C' in FIG. 2A.

As illustrated in FIG. 3, a lower layer portion 14a of the back gate electrode film 14 is formed on the insulating layer 13. A trench 14s is formed in the lower layer portion 14a. A first trench 14t extending in the Y direction is formed in the trench 14s of the lower layer portion 14a. A portion of a top face of the insulating layer 13 is exposed at the bottom of the first trench 14t. The second insulating film 15 is formed in the first trench 14t. The second insulating film 15 is, for example, formed using an insulating material that includes silicon oxide. A sacrificial film 21d is formed in the trench 14s of the lower layer portion 14a. The sacrificial film 21d is formed using a material that includes, for example, undoped silicon.

As illustrated in FIG. 4, a portion of the sacrificial film 21d on the second insulating film 15 is removed. Accordingly, a second trench 21s is formed in the sacrificial film 21d. A portion of the top face of the second insulating film 15 is exposed at the bottom of the second trench 21s. The second trench 21s overlaps at least a portion of the second insulating film 15 with respect to the Z direction.

As illustrated in FIG. 5, an upper layer portion 14b of the back gate electrode film 14 is formed on the lower layer portion 14a, the sacrificial film 21d, and the second insulating film 15. As a result, the lower layer portion 14a and the upper layer portion 14b form the back gate electrode film 14. For example, a part 14s of the upper layer portion 14b of the back gate electrode film 14 is disposed on the second insulating film 15. Other part 14t of the upper layer portion 14b of the back gate electrode film 14 is disposed on the lower layer portion 14a.

Figure 6:
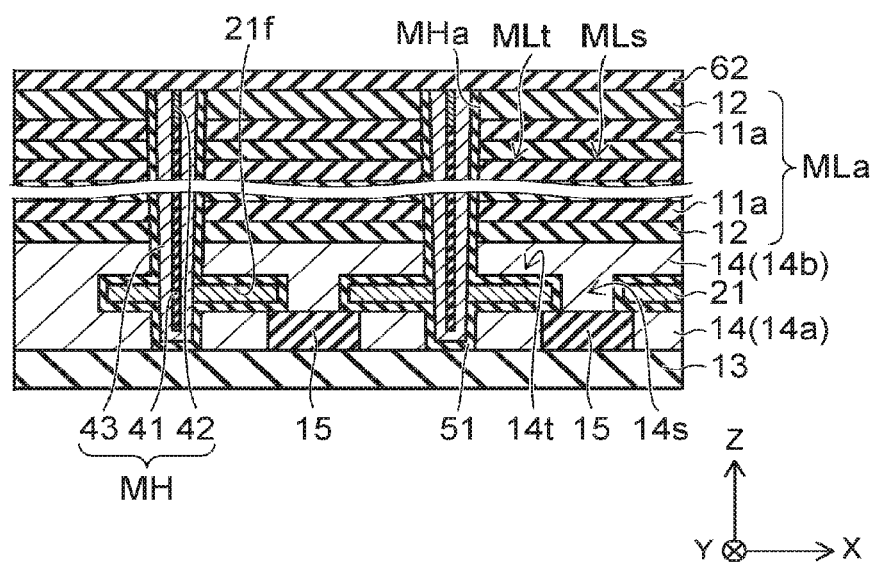

As illustrated in FIG. 6, a stacked body MLa is formed on the back gate electrode film 14. The stacked body MLa includes a plurality of sacrificial layers 11a (first layers) arranged in the Z direction. The stacked body MLa is formed, for example, by stacking the sacrificial layers 11a and the inter-electrode insulating layers 12 in alternation. The sacrificial layers 11a are formed using a material that includes silicon nitride, for example. For example, the stacked body MLa includes a first region MLs and a second region MLt. The first region MLs provides on the part 14s. The second region MLt provides on the other part 14t.

The inter-electrode insulating layers 12 are formed using an insulating material that includes silicon oxide, for example.

Next, reactive ion etching (hereinafter, RIE) is used to form a memory hole MHa passing through the stacked body MLa, the back gate electrode film 14, and the sacrificial film 21d. For example, memory hole MHa passes through the second region MLt, the other part 14t of the upper layer portion 14b, and sacrificial film 21d.

The memory hole MHa does not overlap the second insulating film 15 with respect to the Z direction. Wet etching is applied to the sacrificial film 21d through the memory hole MHa. Accordingly, the sacrificial film 21d is removed. As a result, a cavity 21f (that is, a space) is formed in a portion of the back gate electrode film 14 from which the sacrificial film 21d has been removed. The cavity 21f communicates with the memory hole MHa.

The memory film 51 is formed on inner walls of the memory hole MHa and the cavity 21f. The cavity 21f corresponds to the space in which the sacrificial film 21d (the first film) was disposed before the removing the sacrificial film 21d. The memory film 51 is, for example, formed by stacking a block insulating film, a charge storage film, and a tunnel insulating film in the stated order.

The tunnel insulating film and the block insulating film are, for example, formed using a material that includes silicon oxide. The tunnel insulating film and the block insulating film are, for example, formed using a material that includes any of $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, and AlSiO. The charge storage film is, for example, formed using a material that includes silicon nitride.

A semiconductor material that includes silicon is stacked within the memory hole MHa and the cavity 21f. As a result, the semiconductor film 43 is formed on the side walls of the memory film 51 within the memory hole MHa. The connecting member 21 is formed within the cavity 21f. The core insulating member 41 is formed within the memory hole MHa. The dispersion layer 42 is formed on the core insulating member 41 within the memory hole MHa. As a result, the semiconductor pillar MH, including the core insulating member 41, the dispersion layer 42, and the semiconductor film 43, is formed within the memory hole MHa. The insulating layer 62 is formed on the stacked body MLa, and the semiconductor pillar MH.

Figure 8:
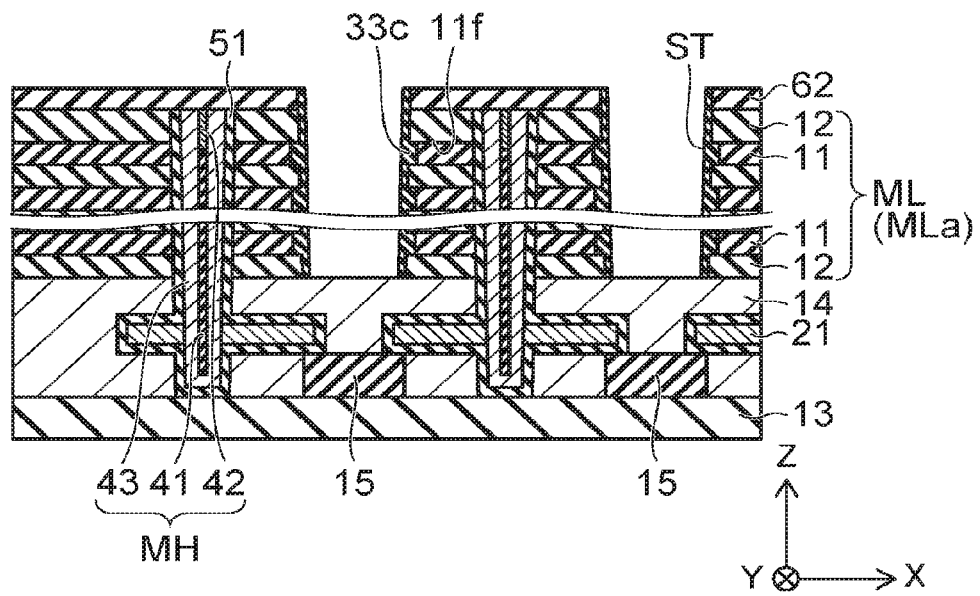
FIGS. 8 to 13 are process cross-sectional views each illustrating the example of the manufacturing method for the semiconductor memory device according to the first embodiment.

As illustrated in FIGS. 7 and 8, a slit ST passing through the insulating layer 62 and the stacked body MLa are formed on the second insulating film 15. For example, the slit ST passing though the insulating layer 62 and the first region MLs of the stacked body MLa.

The slit ST includes a first slit region STa and a second slit region STb. The first slit region STa is substantially shaped as a cylinder extending in the Z direction. The second slit region STb is shaped as a groove extending in the Y direction and the Z direction. In the slit ST, the first slit region STa and the second slit region STb are arranged in the Y direction. For example, the first slit region STa is formed with mutual separation along the Y direction. Also, the second slit region STb is formed between each pair of the first slit regions STa arranged with separation in the Y direction. The first slit region STa and the second slit region STb communicate. At least a portion of the second insulating film 15 overlaps at least a portion of the slit ST with respect to the Z direction. The back gate electrode film 14 is exposed at the bottom of the slit ST. In FIG. 7, components other than the semiconductor pillar MH, the slit ST, the second insulating film 15, and the stacked body ML are omitted from illustration.

As illustrated in FIG. 8, wet etching is applied to the sacrificial layers 11a through the slit ST. Accordingly, the sacrificial layers 11a are removed. As a result, cavities 11f are formed in portions within the stacked body MLa from which the sacrificial layers 11a have been removed. A conductive material such as tungsten is provided within the cavities 11f through the slit ST. Accordingly, the electrode layers 11 are formed within the cavities 11f. Afterward, insulating film 33c is formed on side walls of the slit ST. The insulating film 33c is, for example, formed from a material that includes silicon oxide.

Figure 9:
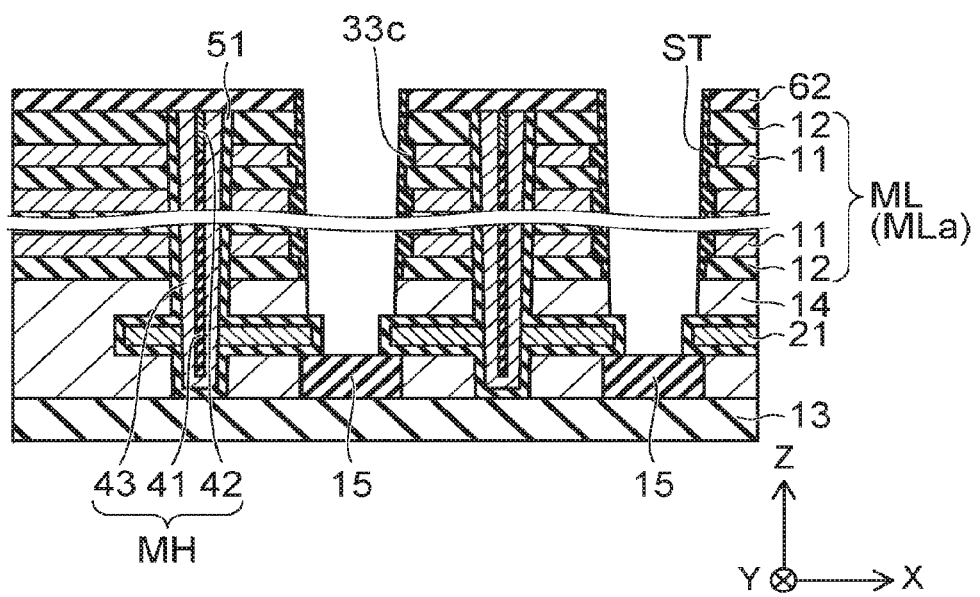

As illustrated in FIG. 9, portions of the back gate electrode film 14 between the second insulating film 15 and the slit ST are removed by anisotropic etching, such as RIE. Accordingly, a portion of the memory film 51 and a portion of the second insulating film 15 are exposed at the bottom of the slit ST.

Figure 10:
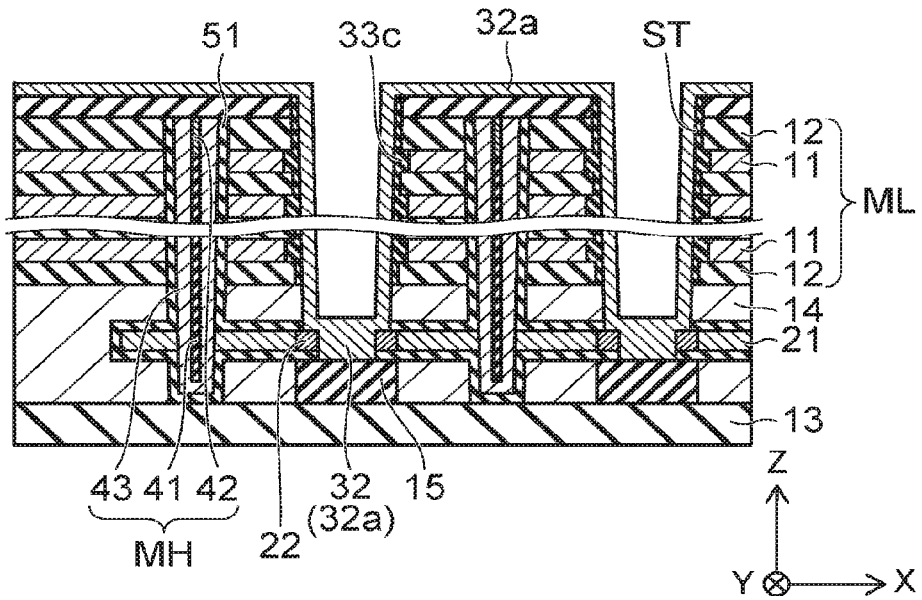

As illustrated in FIG. 10, the portion of the memory film 51 exposed in the slit ST is removed by etching. Accordingly, the connecting member 21 is exposed within the slit ST. Impurities are injected into a portion of the connecting member 21 through the slit ST. Accordingly, portions including the surface of the connecting member 21 become the dispersion layer 22, within the slit ST. A material including a metal such as tungsten is stacked therein. Accordingly, a conductive film 32a is formed.

Figure 11:
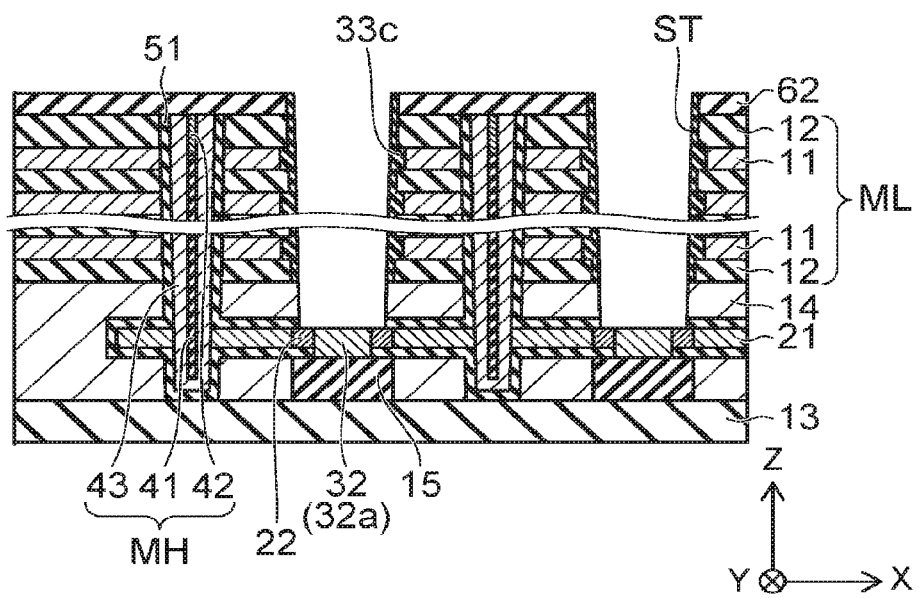

As illustrated in FIG. 11, a portion of the conductive film 32a is removed by an etching process. At this step, a portion of the conductive film 32a on the second insulating film 15 and overlapping the connecting member 21 with respect to the X direction remains. As such, the interconnect portion 32 is formed on the second insulating film 15.

Figure 12:
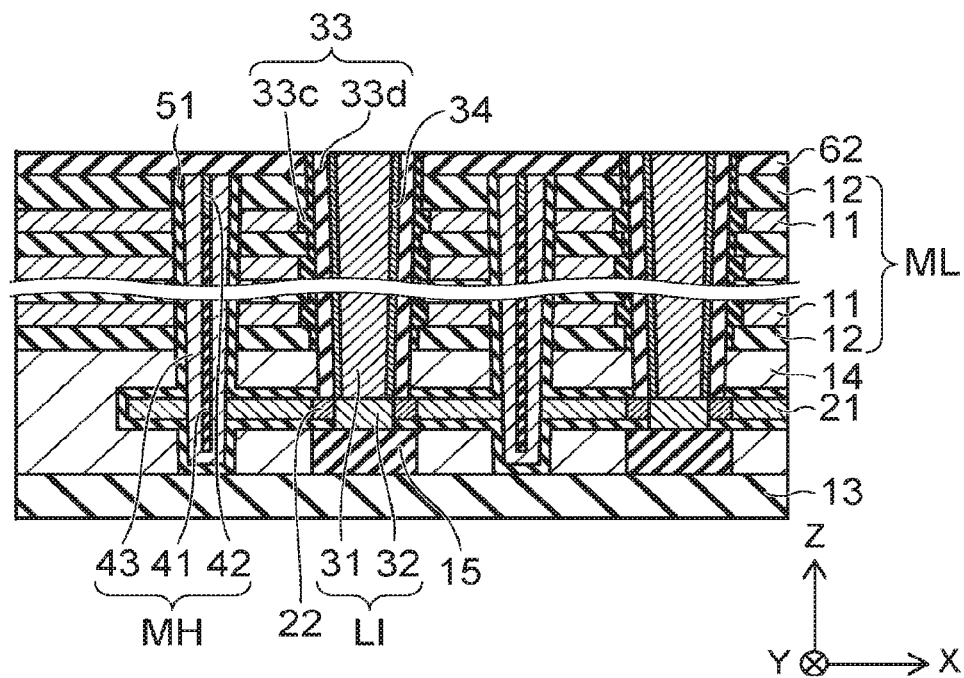
Figure 13:
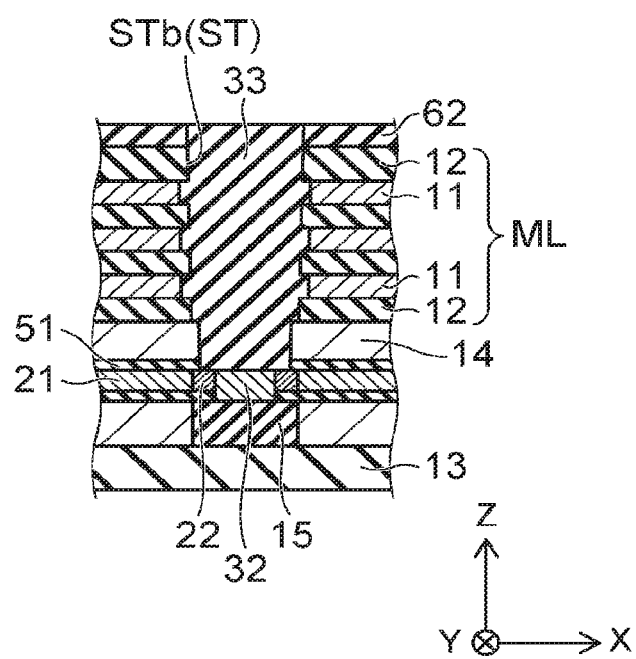

As illustrated in FIG. 12, an insulating material including silicon oxide is, for example, stacked within the slit ST. As a result, an insulating film 33d is formed within the slit ST. Afterward, an etching process is performed. Accordingly, the insulating film 33d is removed at the bottom of the first slit region STa, in the first slit region STa of the slit ST. As such, the top face of the interconnect portion 32 is exposed in the first slit region STa. The insulating film 33d remains on the side walls of the first slit region STa. The insulating film 33d and the insulating film 33c are unified, forming the insulating film 33. Also, as illustrated in FIG. 13, the insulating film 33 is embedded into the second slit region STb.

As illustrated in FIG. 12, a barrier metal film 34 is formed on side walls of the insulating film 33 within the first slit region STa. Afterward, a material including a metal such as tungsten is provided in the barrier metal film 34. Accordingly, the contact portion 31 is formed extending in the Z direction within the first slit region STa. As a result, the conductive member LI is formed, including the contact portion 31 and the interconnect portion 32.

As illustrated in FIG. 1, the insulating layer 63 is formed on the insulating layers 62. The plug P1 is formed on the semiconductor pillar MH, passing through the insulating layer 63. The plug P1 is electrically connected to the semiconductor pillar MH. The plug P2 is formed on the contact portion 31. The plug P2 is electrically connected to the contact portion 31. The source line SL is formed on the plug P2. The source line SL extends in the X direction within the insulating layer 63. The source line SL is electrically connected to the plug P2.

The insulating layer 64 is formed on the insulating layer 63. The bit line BL is formed on the plug P1. The bit line BL is electrically connected to the plug P1. The bit line BL extends in the X direction within the insulating layer 64. As a result, the semiconductor memory device 100 according to the embodiment is manufactured.

A manufacturing method of the semiconductor memory device 100 according to a variation of the embodiment is described.

Figure 14:
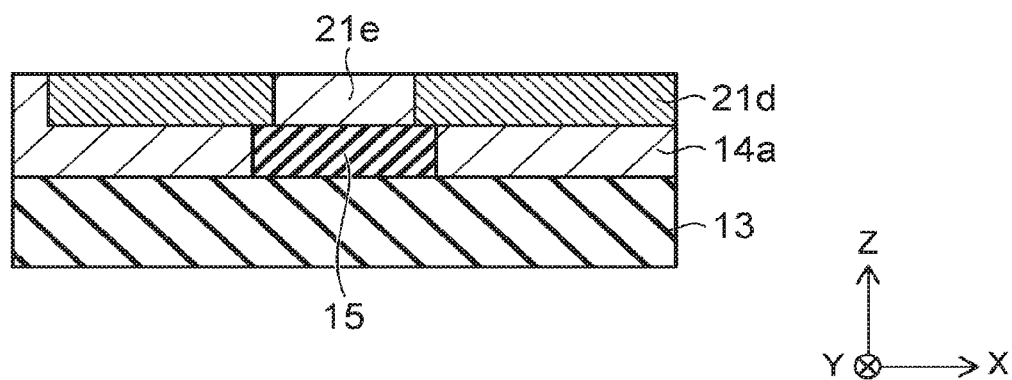
FIG. 14 is a process cross-sectional view illustrating of the manufacturing method of the semiconductor memory device according to a variation of the first embodiment.

FIG. 14 is a process cross-sectional view illustrating the manufacturing method of the semiconductor memory device 100 according to the variation of the embodiment. FIG. 14 is a cross-sectional view illustrating a region corresponding to region R1 illustrated in FIG. 1.

First, the process illustrated in FIG. 3 is performed.

Next, as illustrated in FIG. 14, impurities such as boron are injected into a portion of the sacrificial film 21d on a second insulating film. As a result, a sacrificial film 21e is formed on the second insulating film.

As illustrated in FIG. 5, the upper layer portion 14b of the back gate electrode film 14 is formed on the lower layer portion 14, the sacrificial film 21d, 21e, and the second insulating film 15. As a result, the back gate electrode film 14 is formed from the lower layer portion 14a, the upper layer portion 14b, and the sacrificial film 21e.

Afterward, the processes illustrated in FIGS. 6 to 13 are performed, and the semiconductor memory device 100 according to the embodiment is thus manufactured.

As comparative example, contrary to the embodiment, a situation may be considered in which the interconnect portion 32 is a dispersion layer. The dispersion layer is connected to the source line SL through the contact portion 31. In such a situation, cell current may decrease due to dispersion layer resistivity.

Conversely, in the embodiment, the interconnect portion 32 inducing a metal such as tungsten is provided. The interconnect portion 32 has a lower resistivity value than the dispersion layer. Accordingly, the decrease in cell current may be suppressed. Compared to the case of the dispersion layer, the thickness of the interconnect portion 32 is reduced because of the interconnect portion 32 has a lower resistivity value than the dispersion layer. Accordingly, for example, the size of the semiconductor memory device may be reduced in the X direction.

In addition, the distance between two of the contact portions 31 connected to the interconnect portion 32 may be expanded compared to a situation in which the dispersion layer is provided instead of the interconnect portion 32. The source line SL connected to the interconnect portion 32 through the contact portion 31 extends along the Y direction, similarly to the bit line BL. As such, there is some difficulty in providing the bit line BL on the semiconductor pillar overlapping the source line SL of the stacked body ML with respect to the Z direction. Given that the distance between two of the contact portions 31 connected to the interconnect portion 32 is expanded, the number of source lines SL per surface area may be decreased.

As a result, the regions in which arranging the bit line BL on the stacked body ML is difficult may be reduced. Accordingly, the memory density of the semiconductor memory device may be improved.

Second Embodiment

Figure 15:
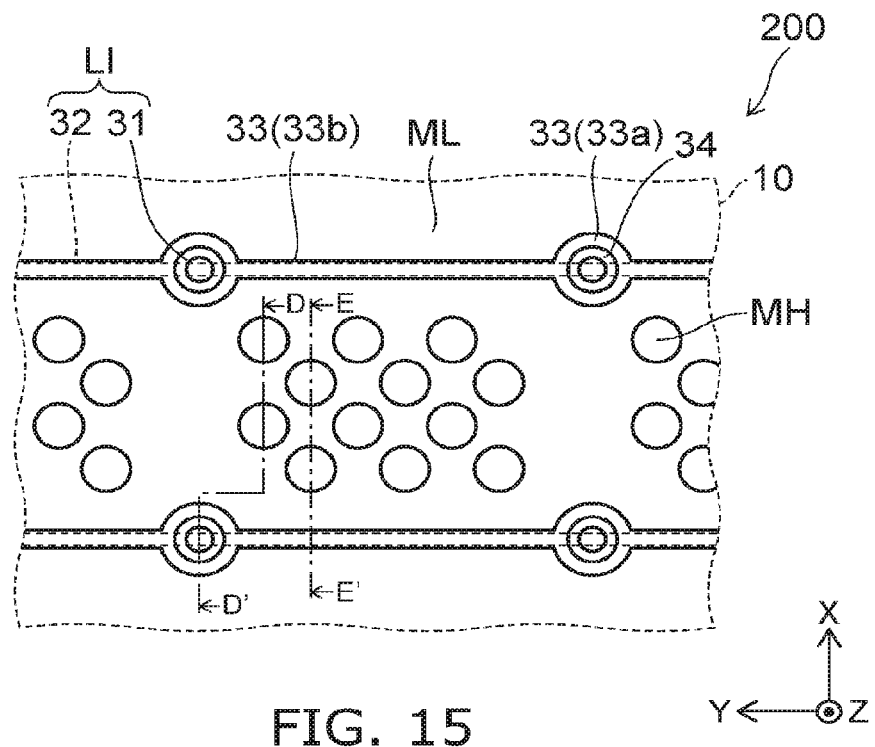
FIG. 15 is a plan view illustrating an example of a semiconductor memory device according to a second embodiment.

FIG. 15 is a plan view illustrating an example of a semiconductor memory device according to the embodiment.

Figure 16:
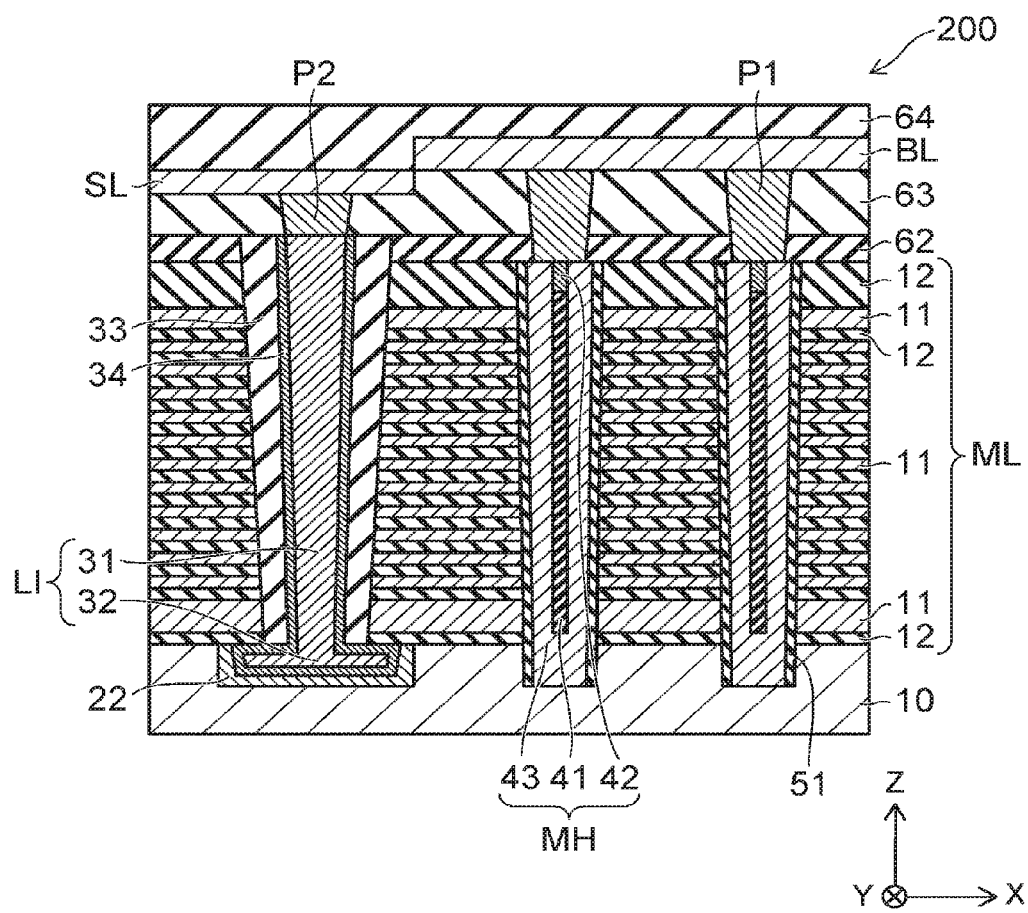
FIGS. 16 and 17 are cross-sectional views illustrating the example of the semiconductor memory device according to the second embodiment.
Figure 17:
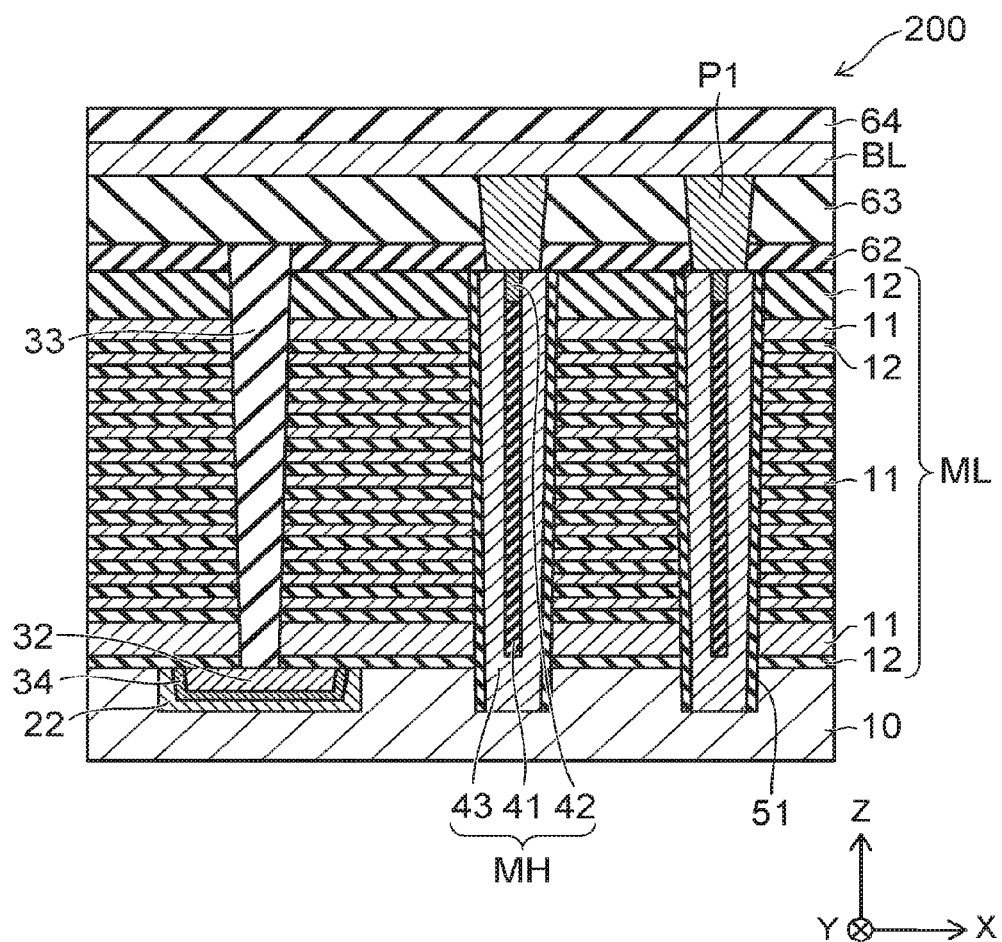

FIGS. 16 and 17 are cross-sectional views illustrating the example of the semiconductor memory device according to the embodiment.

Figure 18:
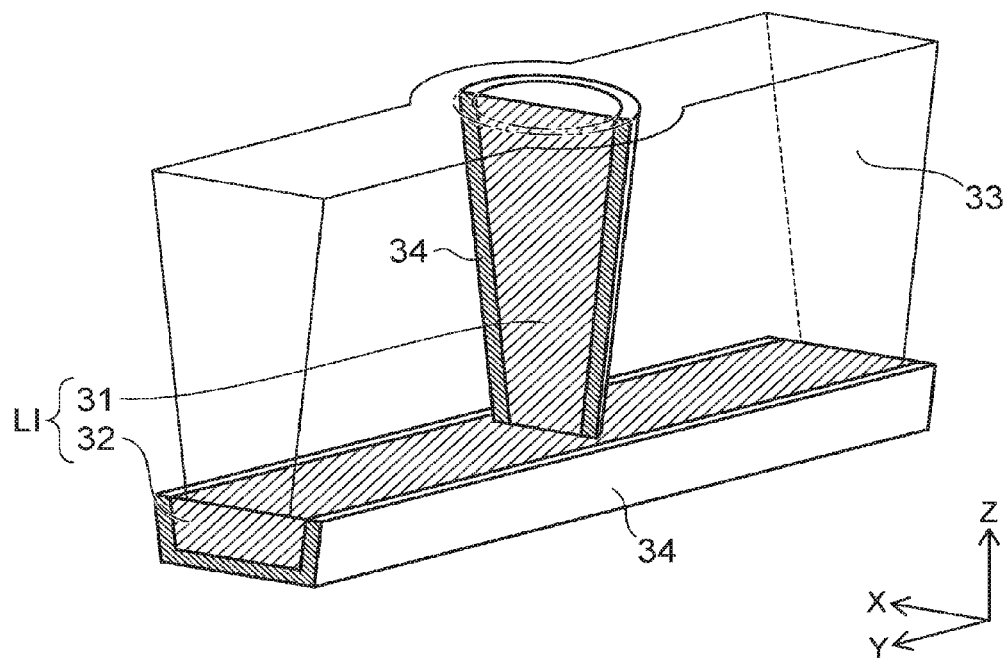
FIG. 18 is a perspective view illustrating an example of the shape of a conductive member.

FIG. 18 is a perspective view illustrating an example of the shape of a conductive member.

FIG. 16 is a cross-sectional view illustrating an example of a cross-section along line D-D' in FIG. 15. FIG. 17 is a cross-sectional view illustrating an example of a cross-section along line E-E' in FIG. 15.

As illustrated in FIG. 15, in the embodiment, the stacked body ML is, for example, provided on a substrate 10, which is a silicon substrate or the like. As illustrated in FIGS. 16, 17, and 18, the interconnect portion 32 is provided between a portion of the substrate 10 and a portion of the stacked body ML. The interconnect portion 32 extends in the X direction within the substrate 10. The dispersion layer 22 is provided between the substrate 10 and the interconnect portion 32. The barrier metal film 34 is provided between the stacked body ML and the contact portion 31, and between the substrate 10 and the interconnect portion 32. In FIG. 18, components other than the conductive member LI, the insulating film 33, and the barrier metal film 34 is omitted from illustration.

In a semiconductor memory device 200 according to the embodiment, the back gate electrode film 14, the second insulating film 15, the connecting member 21, and the insulating film 13 of the semiconductor memory device 100 are not provided.

The semiconductor memory device 200 is identical to the semiconductor memory device 100 with the exception of the above-described components.

A manufacturing method of the semiconductor memory device 200 according to the embodiment is described.

Figure 19:
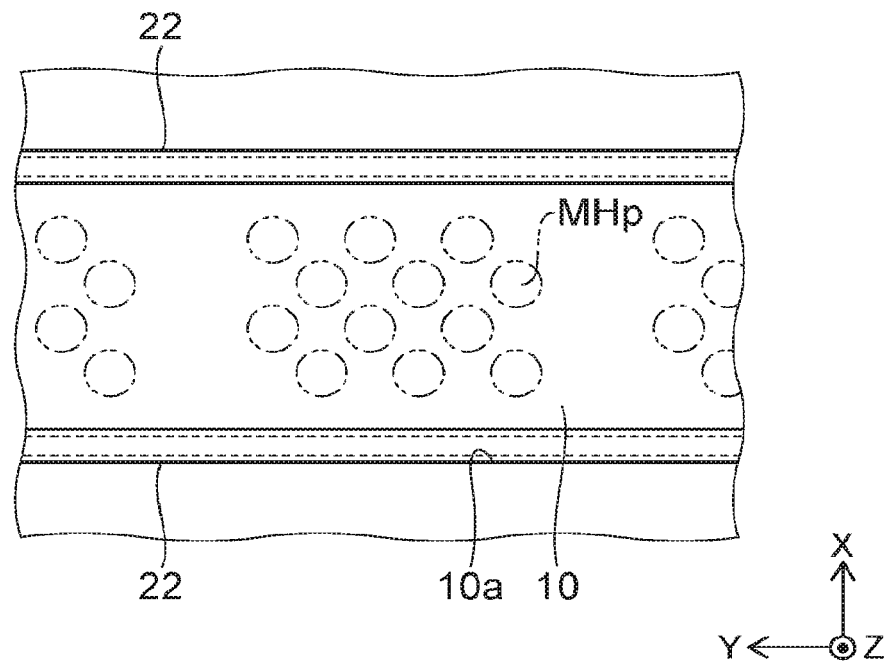
FIG. 19 is a plan view illustrating a first example of a manufacturing method for the semiconductor memory device according to the second embodiment.

FIG. 19 is a plan view illustrating an example of a manufacturing method for the semiconductor memory device according to the embodiment.

FIGS. 20 to 25 are process cross-sectional views illustrating the example of the method of manufacturing the semiconductor memory device according to the embodiment.

Figure 20:
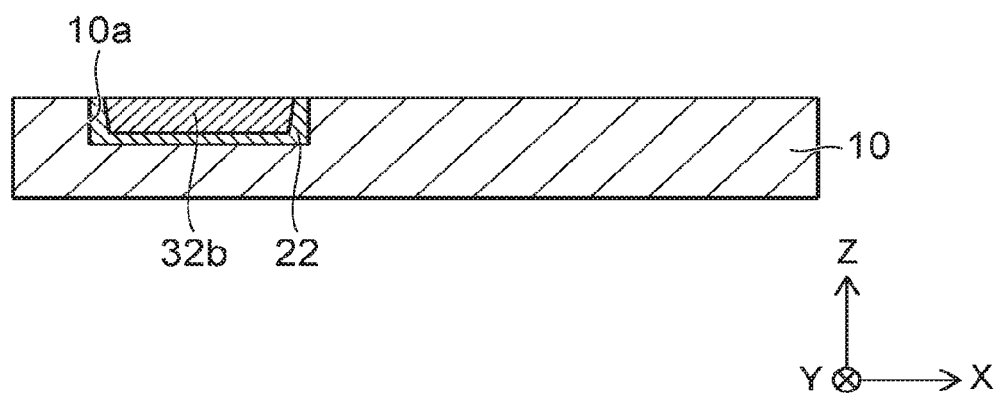
FIGS. 20 to 25 are process cross-sectional views illustrating a first example of the method of manufacturing the semiconductor memory device according to the second embodiment.
Figure 21:
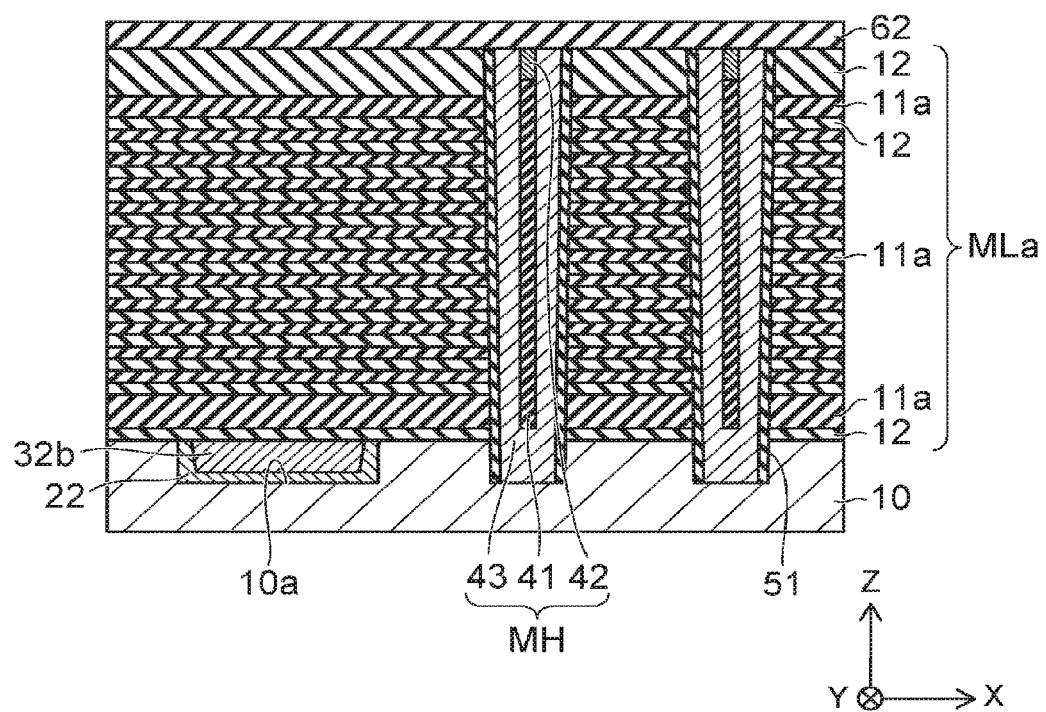
Figure 23:
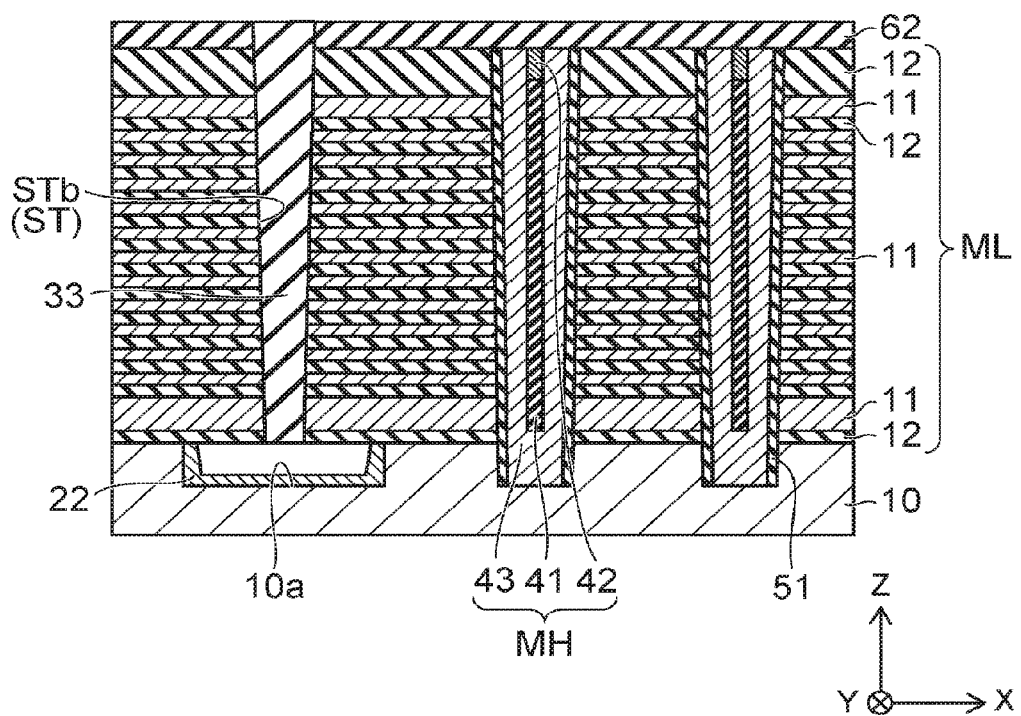
Figure 24:
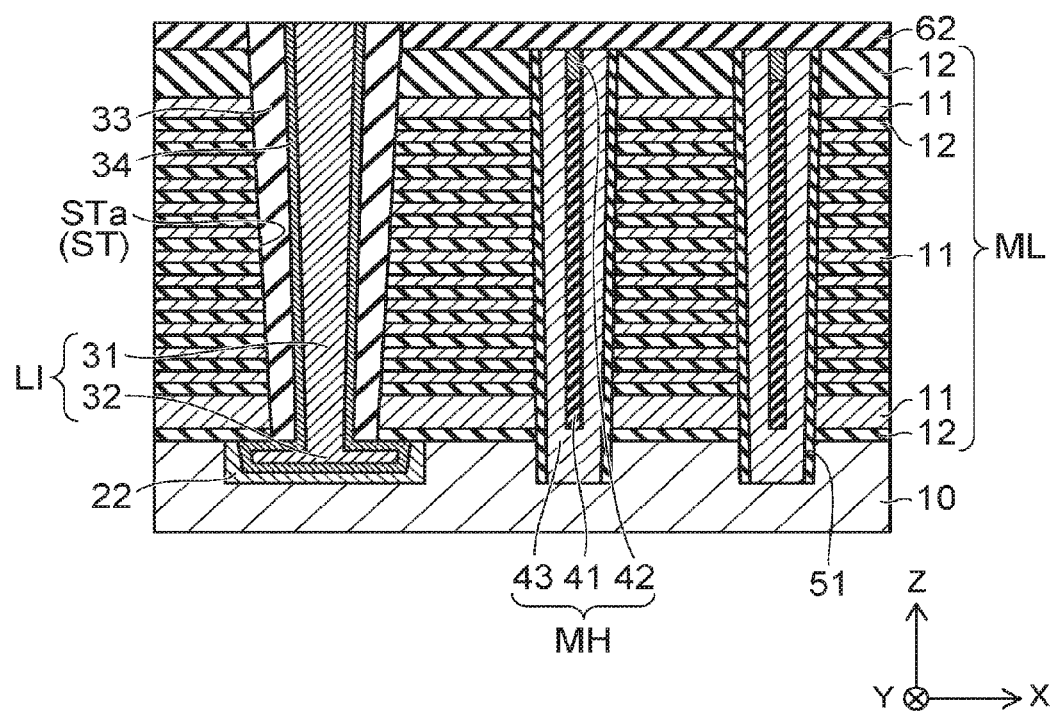
Figure 25:
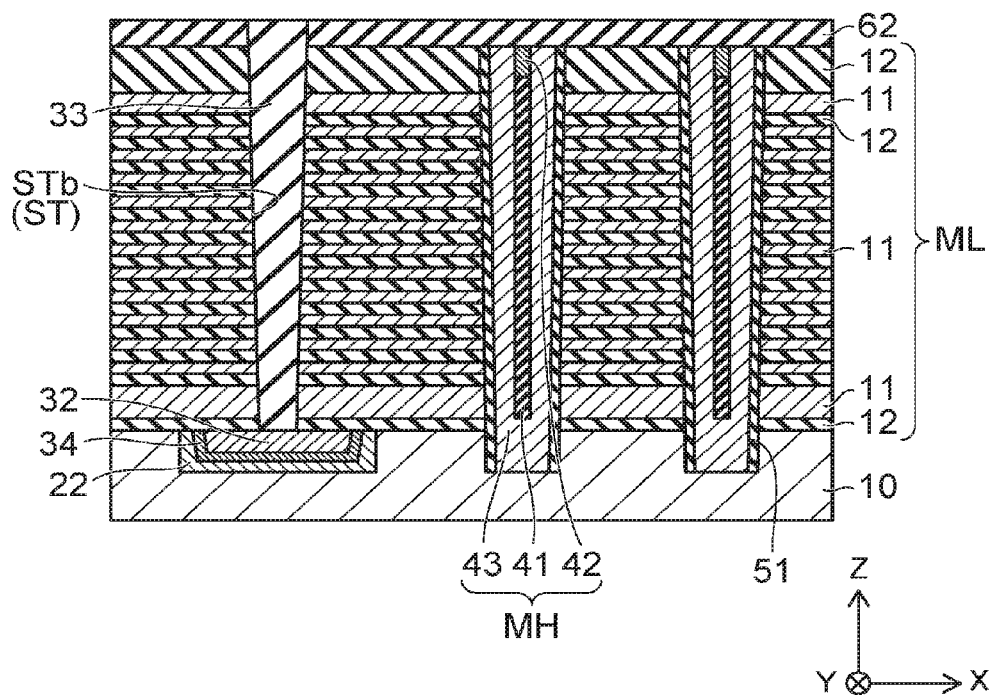

FIGS. 20, 21, and 24 are cross-sectional views corresponding to the cross-section along line D-D' in FIG. 15. FIGS. 23 and 25 are cross-sectional views corresponding to the cross-section along line E-E' in FIG. 15.

As illustrated in FIGS. 19 and 20, a trench 10a extending in the Y direction is formed in a portion of the substrate 10. Ion injection is applied to the substrate 10 through the trench 10a. As a result, the dispersion layer 22 is formed on the substrate 10. A region MHp illustrated in FIG. 19 is a region of formation for the semiconductor pillar MH in a later-described process. As illustrated in FIG. 20, a sacrificial film 32b is provided in the trench 10a. The sacrificial film 32b extends in the Y direction.

As illustrated in FIG. 21, the stacked body MLa is formed on the substrate 10. The stacked body MLa includes a plurality of the sacrificial layers 11a (first layers) arranged in the Z direction. The stacked body MLa is formed, for example, by stacking the sacrificial layers 11a and the inter-electrode insulating layers 12 in alternation. The sacrificial layers 11a are formed using a material that includes silicon nitride, for example. The inter-electrode insulating layers 12 are formed using an insulating material that includes silicon oxide, for example.

The memory hole MHa passing through the stacked body MLa is formed by anisotropic etching, such as RIE. The memory hole MHa reaches the substrate 10. The memory hole MHa does not overlap with the sacrificial film 32b with respect to the Z direction.

The memory film 51 is formed on inner walls of the memory hole MHa. The memory film 51 is, for example, formed by stacking a block insulating film, a charge storage film, and a tunnel insulating film in the stated order.

A semiconductor material that includes silicon is stacked within the memory hole MHa. Afterward, RIE is used to remove a portion of the memory film 51 formed at the bottom of the memory hole MHa. Subsequently, a semiconductor material is additionally stacked within the memory hole MHa. As a result, the semiconductor film 43 is formed within the memory hole MHa. The semiconductor film 43 is electrically connected to the substrate 10. The core insulating member 41 is formed within the memory hole MHa. The dispersion layer 42 is formed on the core insulating member 41 within the memory hole MHa. As a result, the semiconductor pillar MH, including the core insulating member 41, the dispersion layer 42, and the semiconductor film 43, is formed within the memory hole MHa. The insulating layer 62 is formed on the stacked body MLa and the semiconductor pillar MH.

Figure 22:
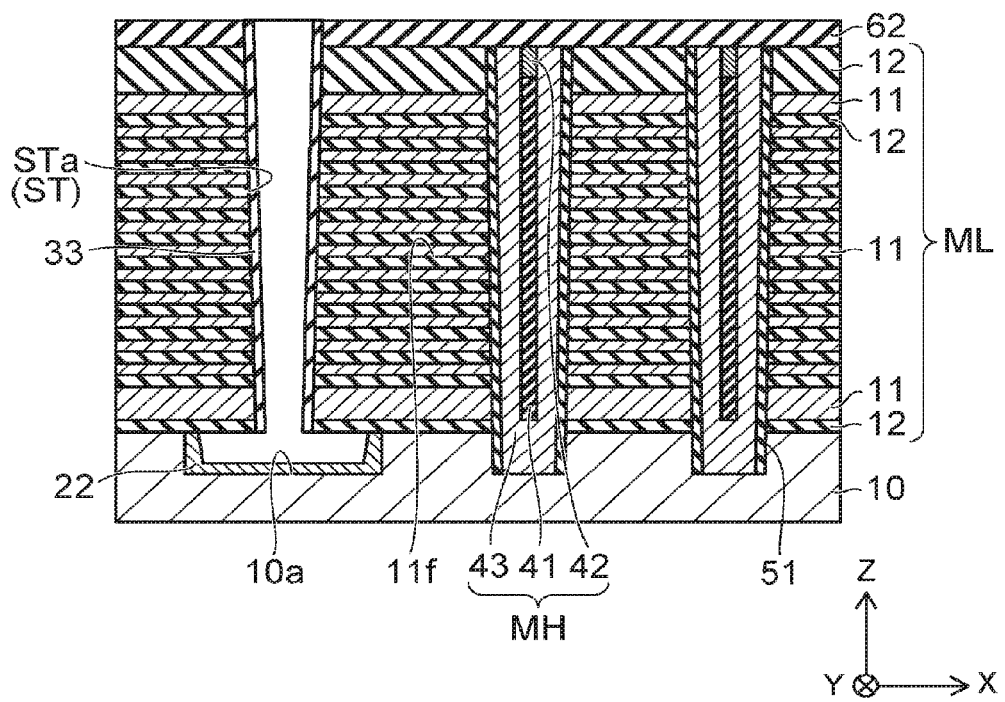

As illustrated in FIG. 22, the slit ST is formed by anisotropic etching, such as RIE. The slit ST passes through the stacked body MLa and reach the sacrificial film 32b.

As illustrated in FIGS. 22 and 23, the slit ST includes the first slit region STa and the second slit region STb. The first slit region STa is substantially shaped as a cylinder extending in the Z direction. The second slit region STb is shaped as a groove extending in the Y direction and the Z direction. In the slit ST, the first slit region STa and the second slit region STb are arranged along the Y direction. The first slit region STa and the second slit region STb communicate.

Wet etching is applied to the sacrificial layers 11a through the slit ST. Accordingly, the sacrificial layers 11a are removed. The cavities 11f are formed in portions from which the sacrificial layers 11a have been removed. A conductive material such as tungsten is provided in the cavities 11f through the slit ST. Accordingly, the electrode layers 11 are formed within the cavities 11f. The insulating film 33 is formed within the slit ST.

As illustrated in FIG. 22, in the first slit region STa, the insulating film 33 is formed on side walls of the first slit region STa. Also, as illustrated in FIG. 23, in the second slit region STb, the insulating film 33 is embedded into the second slit region STb.

As illustrated in FIGS. 22 and 23, etching is performed on the sacrificial film 32b through the slit ST (the first slit region STa). Accordingly, the sacrificial film 11a is removed from within the trench 10a.

As illustrated in FIG. 24, the barrier metal film 34 is formed on a side wall of the insulating film 33 and on inner walls of the trench 10a, in the first slit region STa. A material including a metal such as tungsten is provided within the first slit region STa and the trench 10a. As a result, the contact portion 31 is formed within the first slit region STa.

As illustrated in FIG. 25, the interconnect portion 32 is provided in the trench 10a. As a result, the conductive member LI is formed including the contact portion 31 and the interconnect portion 32. The contact portion 31 is, for example, substantially shaped as a cylinder extending in the Z direction. The interconnect portion 32 extends in the Y direction within the substrate 10.

As illustrated in FIG. 16, the insulating layer 63 is formed on the insulating layer 62. The plug P1 is formed on the semiconductor pillar MH, passing through the insulating layer 63. The plug P1 is electrically connected to the semiconductor pillar MH. The plug P2 is formed on the contact portion 31. The plug P2 is electrically connected to the contact portion 31. The source line SL is formed on the plug P2. The source line SL extends in the X direction within the insulating layer 63. The source line SL is electrically connected to the plug P2.

The insulating layer 64 is formed on the insulating layer 63. The bit line BL is formed on the plug P1. The bit line BL is electrically connected to the plug P1. The bit line BL extends in the X direction within the insulating layer 64. As a result, the semiconductor memory device 200 according to the embodiment is manufactured.

A second example of a manufacturing method of the semiconductor memory device 200 according to the embodiment is described.

Figure 26:
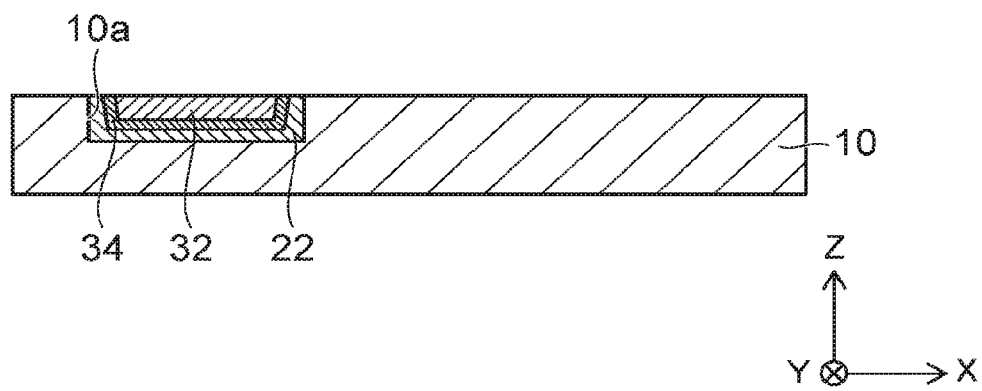
FIG. 26 is a process cross-sectional view illustrating a second example of the method of manufacturing the semiconductor memory device according to the second embodiment.

FIG. 26 is a process cross-sectional view illustrating the second example of the method of manufacturing the semiconductor memory device 200 according to the embodiment.

As illustrated in FIG. 26, the trench 10a is formed in the substrate 10. Afterward, impurities are injected into the substrate 10 through the trench 10a. As a result, the dispersion layer 22 is formed on the substrate 10. The barrier metal film 34 is formed on inner walls of the trench 10a. Subsequently, a conductive material such as tungsten is provided in the trench 10a. As a result, the interconnect portion 32 of the conductive member LI is formed in the trench 10a.

Afterward, the process proceeds identically to the first example. In the example, the sacrificial film 32b is not formed. As such, the process of removing the sacrificial film 32b is omitted from the processes illustrated in FIGS. 22 and 23.

A third example of a manufacturing method of the semiconductor memory device 200 according to the embodiment is described.

Figure 27:
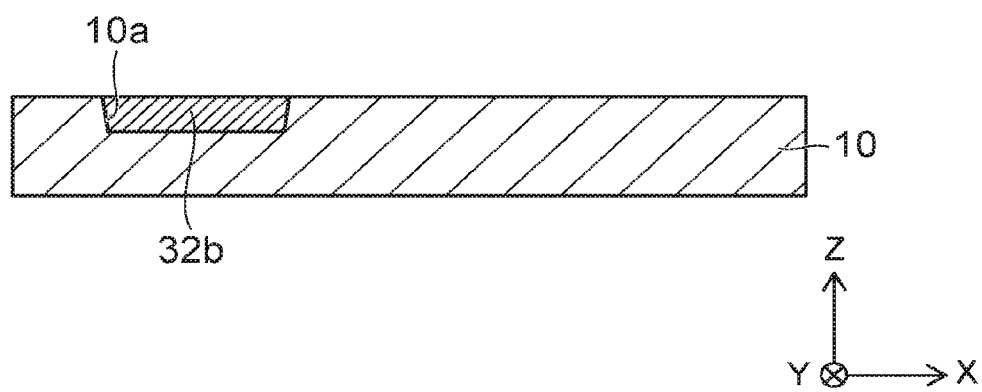
FIG. 27 is a process cross-sectional view illustrating a third example of the method for manufacturing the semiconductor device according to the second embodiment.

FIG. 27 is a process cross-sectional view illustrating the third example of the method for manufacturing the semiconductor device 200 according to the embodiment.

As illustrated in FIG. 27, the trench 10a is formed in the substrate 10. The sacrificial film 32b is formed in the trench 10a. Afterward, in the example, the process illustrated in FIG. 22 involves forming the dispersion layer 22 on the substrate 10 by applying plasma doping to the substrate 10 through the slit ST. In addition, the dispersion layer 22 may be formed by solid phase diffusion.

In the example, in a situation where annealing is performed after forming the semiconductor pillar MH, extension of the dispersion layer 22 can be suppressed during the annealing.

In the embodiment, the interconnect portion 32 extending in the Y direction within the substrate 10 is provided. Similarly to the first embodiment, the interconnect portion 32 is provided with a lower resistivity value than the dispersion layer and thus, a decrease in cell current can be suppressed.

In addition, similarly to the first embodiment, the distance between a pair of the contact portions 31 connected to the interconnect portion 32 may be expanded. Given that the distance between the pair of the contact portions 31 connected to the interconnect portion 32 is expanded, the number of source lines SL per surface area may be decreased. As such, the memory density of the semiconductor memory device can be improved.

Also, a configuration may be considered in which the dispersion layer is provided instead of the interconnect portion 32, and a contact portion is provided thereon with a shape extending in the Y direction and the Z direction. In such a situation, an insulating film corresponding to the first insulating film 33 is provided between the contact portion and the stacked body ML. In the embodiment, the second insulating portion 33b (a portion of the first insulating film 33) is provided between a pair of the contact portions 31, which are substantially shaped as cylinders, neighboring each other in the Y direction. With respect to the Y direction, the thickness of the second insulating portion 33b may be thinner than the total thickness of the plate-shaped contact portion and the insulating film. That is, in the embodiment, the size of the semiconductor memory device can be reduced in the Y direction. Also, in comparison to a situation where the interconnect portion 32 is the dispersion layer, the shape of the dispersion layer 22 may include great variability. For example, in a situation where the interconnect portion 32 is the dispersion layer, the precise shape may be defined using ultra-fine lithography. Conversely, in the situation of the embodiment, precise control of lithography is not required as much as in the situation where the interconnect portion 32 is the dispersion layer.

Figure 28:
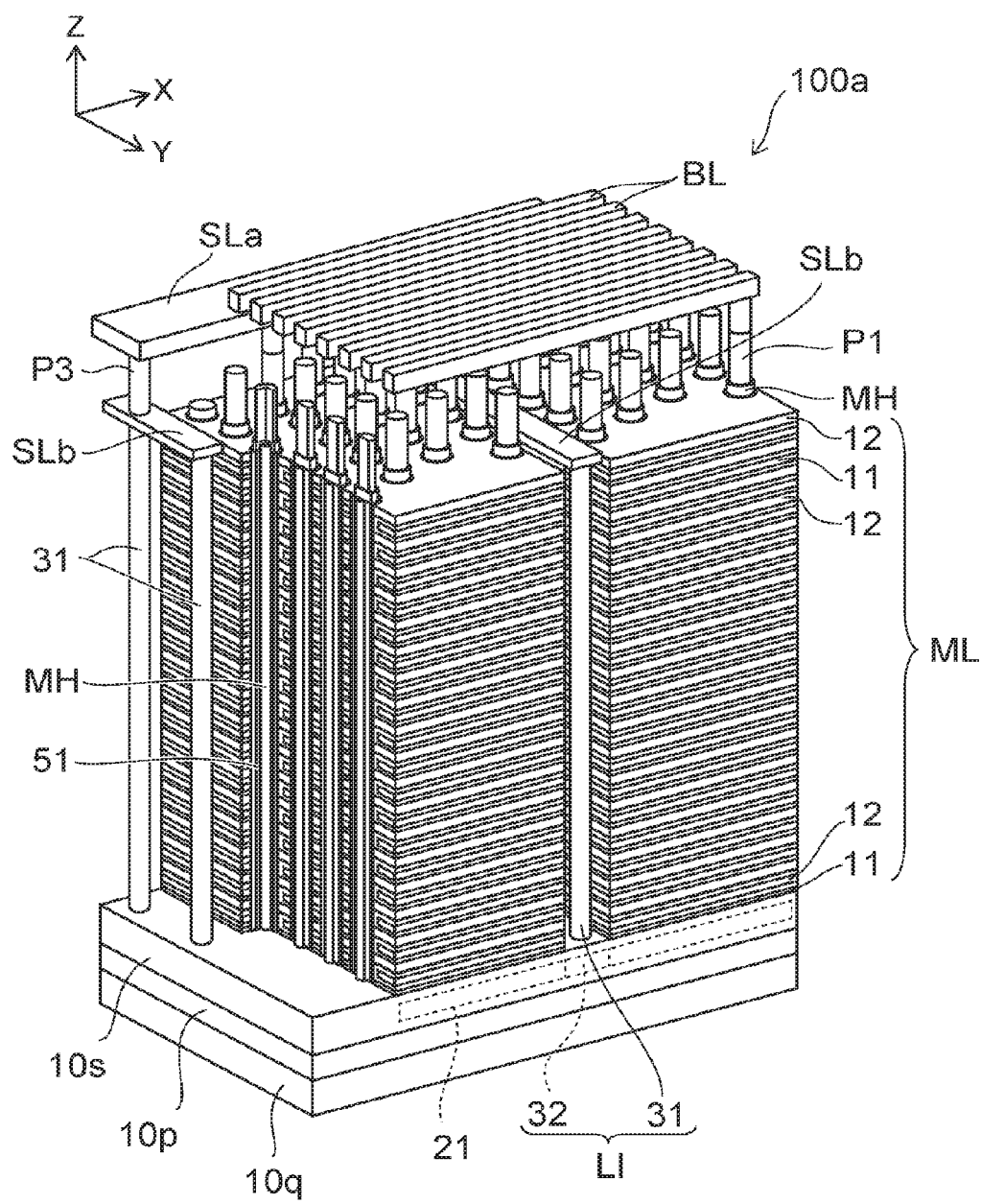
FIG. 28 is a perspective view of the semiconductor memory device according to a variation of the first embodiment.

FIG. 28 is a perspective view of the semiconductor memory device according to a variation of the first embodiment.

As illustrated in FIG. 28, a semiconductor memory device 100a according to the example is provided with an insulating layer 10p on a substrate 10q. The insulating layer 10p corresponds to the insulating layer 13 of the semiconductor memory device 100. An electrode film 10s is provided on the insulating layer 10p. The electrode film 10s corresponds to the back gate electrode film 14 of the semiconductor memory device 100. The connecting member 21 is provided within the back gate electrode film 14. The stacked body ML and the semiconductor pillar MH are provided on the insulating layer 10s. Similarly to the semiconductor memory device 100, the semiconductor pillar MH extends in the Z direction within the stacked body ML.

Also, similarly to the semiconductor memory device 100, the conductive member LI including the contact portion 31 and the interconnect portion 32 is provided. The contact portion 31 extends in the Z direction within the stacked body ML.

The interconnect portion 32 extends, for example, in the Y direction within the electrode film 10s. The interconnect portion 32 is electrically connected to the connecting member 21. The memory film 51 is provided between the stacked body ML and the semiconductor pillar MH and between the connecting member 21 and the electrode film 10s. Wiring SLa extending in the X direction is provided on the contact portion 31. In addition, the bit line BL extending in the X direction is provided on the semiconductor pillar MH. The semiconductor pillar MH is electrically connected to the bit line BL through the plug P1. With respect to the Z direction, the distance between the stacked body ML and the bit line BL is longer than the distance between the stacked body ML and the wiring SLb. For example, the wiring SLb is positioned between the bit line BL and the stacked body ML. The wiring SLa and the contact portion 31 are electrically connected.

Wiring SLb extending in the Y direction is provided on the stacked body ML. With respect to the Y direction, at least a portion of the wiring SLa overlaps at least a portion of the bit line BL. The wiring SLb and the wiring SLa are electrically connected through the plug P3.

Other components are identical to the semiconductor memory device 100.

Figure 29:
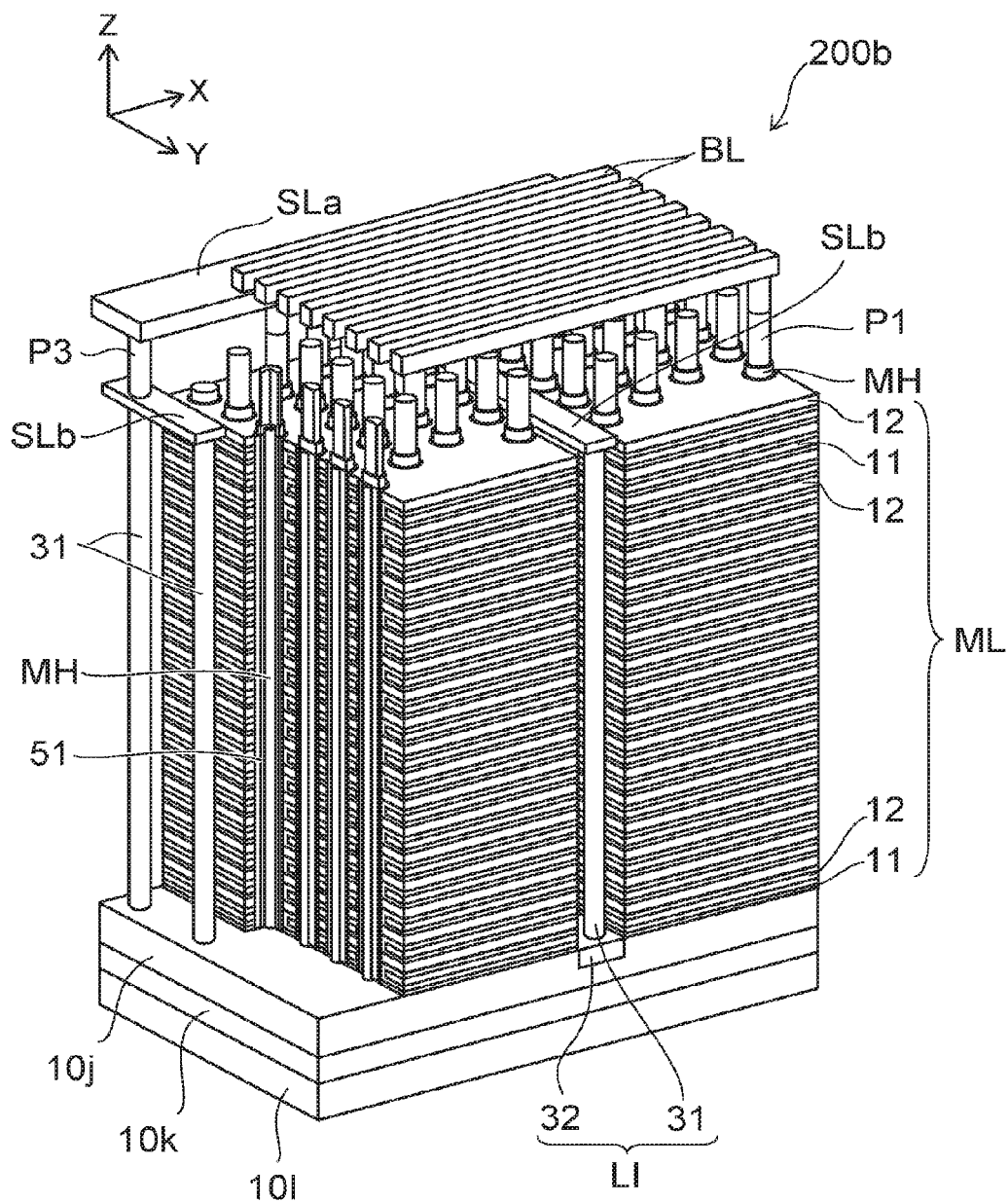
FIG. 29 is a perspective view of the semiconductor memory device according to a variation of the second embodiment.

FIG. 29 is a perspective view of another example of the semiconductor memory device according to a variation of the second embodiment.

As illustrated in FIG. 29, in a semiconductor memory device 200b according to the variation, an insulating layer 10k is provided on a substrate 101. The insulating layer 10k may include circuit elements, such as transistors and a wiring layer, for example. A semiconductor film 10j is provided on the insulating layer 10k. The semiconductor film 10j may also be a conductive film. The semiconductor film 10j corresponds to the substrate 10 of the semiconductor memory device 200.

The stacked body ML and the semiconductor pillar MH are provided on the semiconductor film 10j. Similarly to the semiconductor memory device 200, the semiconductor pillar MH extends in the Z direction within the stacked body ML.

Also, similarly to the semiconductor memory device 200, the conductive member LI including the contact portion 31 and the interconnect portion 32 is provided. The contact portion 31 extends in the Z direction within the stacked body ML.

The interconnect portion 32 extends in the Y direction, for example, within the semiconductor film 10j. The memory film 51 is provided between the stacked body ML and the semiconductor pillar MH. The wiring SLa extending in the X direction is provided on the contact portion 31. In addition, the bit line BL extending in the X direction is provided on the semiconductor pillar MH. The semiconductor pillar MH is electrically connected to the bit line BL through the plug P1. With respect to the Z direction, the distance between the stacked body ML and the bit line BL is longer than the distance between the stacked body ML and the wiring SLb. For example, the wiring SLb is positioned between the bit line BL and the stacked body ML. The wiring SLa and the contact portion 31 are electrically connected.

The wiring SLb extending in the Y direction is provided on the stacked body ML. With respect to the Y direction, at least a portion of the wiring SLa overlaps at least a portion of the bit line BL. The wiring SLb and the wiring SLa are electrically connected through the plug P3.

Other components are identical to the semiconductor memory device 200.

Figure 30:
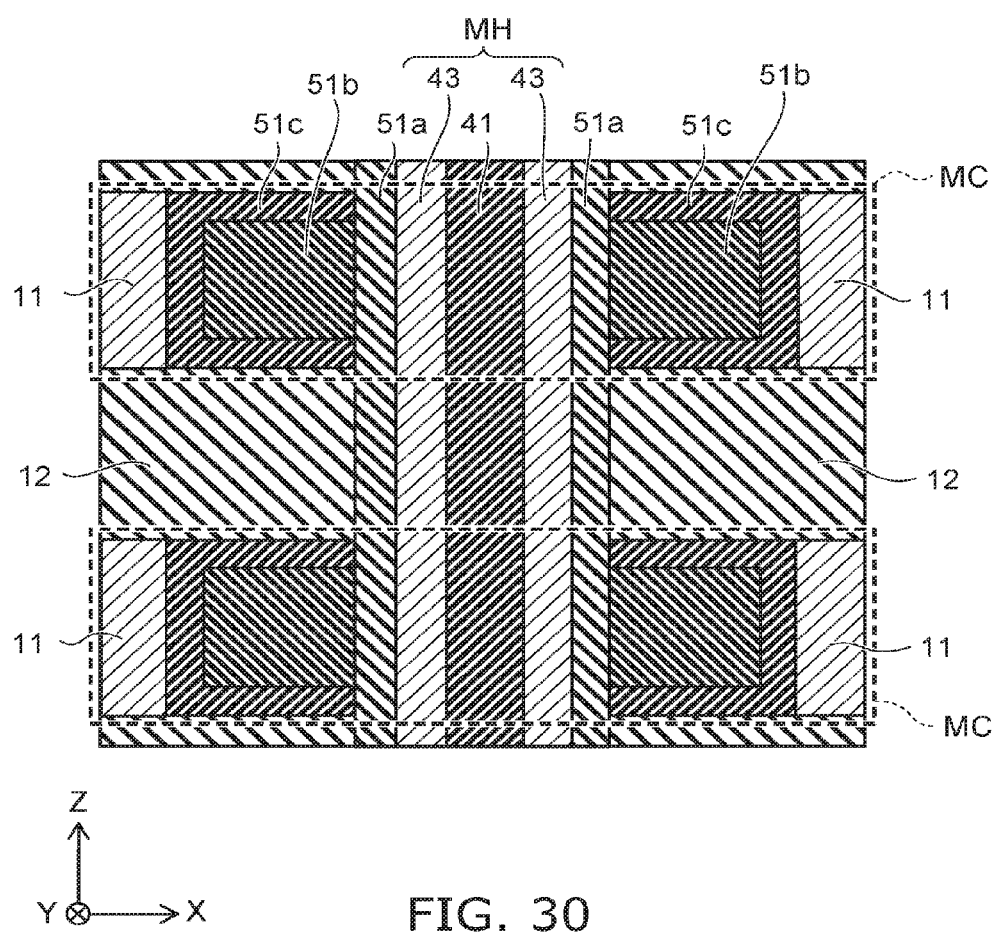
FIG. 30 is a cross-sectional view illustrating another example of a semiconductor memory device.

FIG. 30 is a cross-sectional view illustrating another example of a semiconductor memory device.

FIG. 30 is an enlarged schematic cross-sectional view of the part of semiconductor pillar MH.

As illustrated in FIG. 30, the memory film 51 includes, for example, a block insulating films 51a, the charge storage films 51b, and a tunnel insulating film 51c. The charge storage films 51b may be provided at the memory cells (thus, on the electrode layers 11), respectively. The charge storage films 51b are stacked with the inter-electrode insulating layers 12, respectively. The charge storage films 32 may be include, for example, a semiconductor material being silicon and so on.

Similarly to the charge storage films 52b, the block insulating films 51a may be provided respectively. The block insulating films 51a is provided between the electrode layers 11 and the charge storage films 51b, and between the inter-electrode insulating layers 12 and the charge storage films 51b, respectively.

According to the embodiments as described above, a semiconductor memory device and a manufacturing method therefor are able to realize improved memory density.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor memory device, comprising:
a substrate;
a stacked body provided on the substrate, the stacked body including a plurality of electrode layers arranged in a first direction;
a semiconductor pillar extending in the stacked body in the first direction;
a memory film provided between the stacked body and the semiconductor pillar;
a first insulating film extending in the stacked body in the first direction and a second direction crossing the first direction; and
a conductive member including a contact and an interconnect, the contact including metal, the contact extending in the first insulating film in the first direction, the interconnect provided between the substrate and the stacked body, the interconnect extending in the second direction, the interconnect including metal, the interconnect being electrically connected to the contact,
a first length of the first insulating film in a third direction being greater than a second length of the interconnect in the third direction, the third direction crossing the first direction and the second direction,
at least a portion of the contact overlapping a portion of the interconnect in the first direction,
a portion of the first insulating film overlapping the portion of the interconnect in the first direction;
an insulating layer provided between the substrate and the stacked body;
a back gate electrode film provided between the stacked body and the insulating layer; and
a connecting member extending in the back gate electrode film in the second direction and a third direction, and the connecting member including a semiconductor material, the connecting member being electrically connected to the semiconductor pillar and the interconnect, the third direction crossing the first direction and the second direction,
at least a portion of the interconnect and at least a portion of the connecting member overlapping each other in a direction crossing the first direction.
2. The device according to claim 1, further comprising:
a second insulating film provided between the interconnect and the insulating layer, the second insulating film extending in the second direction, wherein at least a portion of the second insulating film overlapping at least a portion of the back gate electrode film in a direction crossing the first direction.

3. A semiconductor memory device, comprising:
a substrate;
a stacked body provided on the substrate, the stacked body including a plurality of electrode layers arranged in a first direction;
a semiconductor pillar extending in the stacked body in the first direction;
a memory film provided between the stacked body and the semiconductor pillar;
a first insulating film extending in the stacked body in the first direction and the second direction crossing the first direction; and
a conductive member including a contact and an interconnect, the contact including metal, the contact extending in the first insulating film in the first direction, the interconnect provided between the substrate and the stacked body, the interconnect extending in the second direction, the interconnect including metal, the interconnect being electrically connected to the contact;
a first length of the first insulating film in a third direction being greater than a second length of the interconnect in the third direction, the third direction crossing the first direction and the second direction,
the first insulating film including a first insulating portion and two of second insulating portions,
the first insulating portion being provided between the two of the second insulating portions in the second direction,
the two of second insulating portions being connected through the first insulating portion, and
the contact extending in the first insulating portions in the first direction.

4. The device according to claim 3, wherein
a length of the first insulating portion in the third direction is greater than a length of the second insulating portions in the third direction.

5. The device according to claim 3, further comprising:
an insulating layer provided between the substrate and the stacked body;
a back gate electrode film provided between the stacked body and the insulating layer; and
a connecting member extending in the back gate electrode film in the second direction and a third direction, and the connecting member including a semiconductor material, the connecting member being electrically connected to the semiconductor pillar and the interconnect, the third direction crossing the first direction and the second direction, at least a portion of the interconnect and at least a portion of the connecting member overlapping each other in a direction crossing the first direction.

6. The device according to claim 5, further comprising:
a second insulating film provided between the interconnect and the insulating layer, the second insulating film extending in the second direction, wherein
at least a portion of the second insulating film overlaps at least a portion of the back gate electrode film in a direction crossing the first direction.

7. The device according to claim 3, wherein
at least a portion of the substrate overlaps at least a portion of the interconnect in a direction crossing the first direction.

8. A semiconductor memory device, comprising:
a stacked body including a plurality of first electrode layers and a plurality of first insulating layers, each of the first insulating layers being provided between the first electrode layers respectively;
a second electrode layer provided below the stacked body via a second insulating layer, the second electrode layer being thicker than a first electrode layer of the first electrode layers;
a channel body extending in a stacking direction of the stacked body and including a first part and a second part, the first part penetrating the stacked body and the second electrode layer, the second part being located below the first part;
a memory film provided so as to cover at least an outer peripheral side surface of the first part;
a silicon containing member in contact with an outer peripheral side surface of the second part, the silicon containing member including a first portion provided below the second electrode layer via an insulating film and a second portion provided below a trench formed through the stacked body and the second electrode layer; and
a metal containing portion electrically connected to the silicon containing member, the metal containing portion extending in a direction orthogonal to the stacking direction below the trench,
the channel body being electrically connected to a source line via the silicon containing member.

9. The device according to claim 8, wherein
the first electrode layers are formed of a conductive material containing tungsten,
the second electrode layer is formed of a silicon containing an impurity.

10. The device according to claim 8, wherein
the silicon containing member spreads in a plate shape along a plane orthogonal to the stacking direction.

* * * * *